(12) United States Patent
Kato et al.

(10) Patent No.: US 12,255,120 B2
(45) Date of Patent: Mar. 18, 2025

(54) SEMICONDUCTOR DEVICE AND METHOD OF MANUFACTURING THE SAME

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventors: Yoshitaka Kato, Nisshin (JP); Takeshi Endo, Nisshin (JP); Kazuhiro Tsuruta, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 426 days.

(21) Appl. No.: 17/824,004

(22) Filed: May 25, 2022

(65) Prior Publication Data
US 2022/0392828 A1    Dec. 8, 2022

(30) Foreign Application Priority Data

Jun. 4, 2021    (JP) .................................. 2021-094356

(51) Int. Cl.
    *H01L 21/56*    (2006.01)
    *H01L 23/31*    (2006.01)
    *H01L 23/433*    (2006.01)
(52) U.S. Cl.
    CPC ........ *H01L 23/4334* (2013.01); *H01L 21/565* (2013.01); *H01L 23/3142* (2013.01)

(58) Field of Classification Search
    CPC ............... H01L 23/4334; H01L 21/565; H01L 23/3142; H01L 21/56; H01L 24/20;
    (Continued)

(56) References Cited

U.S. PATENT DOCUMENTS 5,657,203 A * 8/1997 Hirao ................ H01L 23/49861
                                                    361/752
5,751,058 A * 5/1998 Matsuki ................. H01L 25/18
                                                    361/728

(Continued)

FOREIGN PATENT DOCUMENTS

JP    2011-216503 A    10/2011
JP    2016-178108 A    10/2016

(Continued)

*Primary Examiner* — Galina G Yushina
(74) *Attorney, Agent, or Firm* — Posz Law Group, PLC

(57) ABSTRACT

A semiconductor device includes a power module, a circuit package, and a joint portion joining the power module and the circuit package. The circuit package includes a semiconductor element, a wiring layer electrically connected with the semiconductor element, a heat conductive member, and a second mold resin portion sealing the semiconductor element and the heat conductive member. The wiring layer includes a connecting portion connected with the heat conductive member. One of the connecting portion or the heat conductive member is joined with a signal wire in the power module via the joint portion. The heat conductive member penetrates the second mold resin portion in a thickness direction of the semiconductor element. The heat conductive member and the connecting portion are arranged in a straight line in the thickness direction of the semiconductor element.

13 Claims, 23 Drawing Sheets

(58) Field of Classification Search
CPC .................. H01L 25/03; H01L 21/486; H01L 2224/0401; H01L 2224/81005; H01L 23/3677; H01L 24/19; H01L 24/96; H01L 23/3107; H01L 23/49816; H01L 23/49827
See application file for complete search history.

(56) References Cited

U.S. PATENT DOCUMENTS

| | | | | |
|---|---|---|---|---|
| 8,102,670 | B2* | 1/2012 | Sakamoto | H05K 7/1432 361/792 |
| 9,230,891 | B2* | 1/2016 | Zhang | H01L 23/49562 |
| 2005/0045958 | A1* | 3/2005 | Ichikawa | H01L 27/1203 257/362 |
| 2009/0103276 | A1* | 4/2009 | Sakamoto | H05K 5/065 29/841 |
| 2018/0301350 | A1 | 10/2018 | Haba et al. | |

FOREIGN PATENT DOCUMENTS

| | | |
|---|---|---|
| JP | 2017-103475 A | 6/2017 |
| JP | 2018-041827 A | 3/2018 |

\* cited by examiner

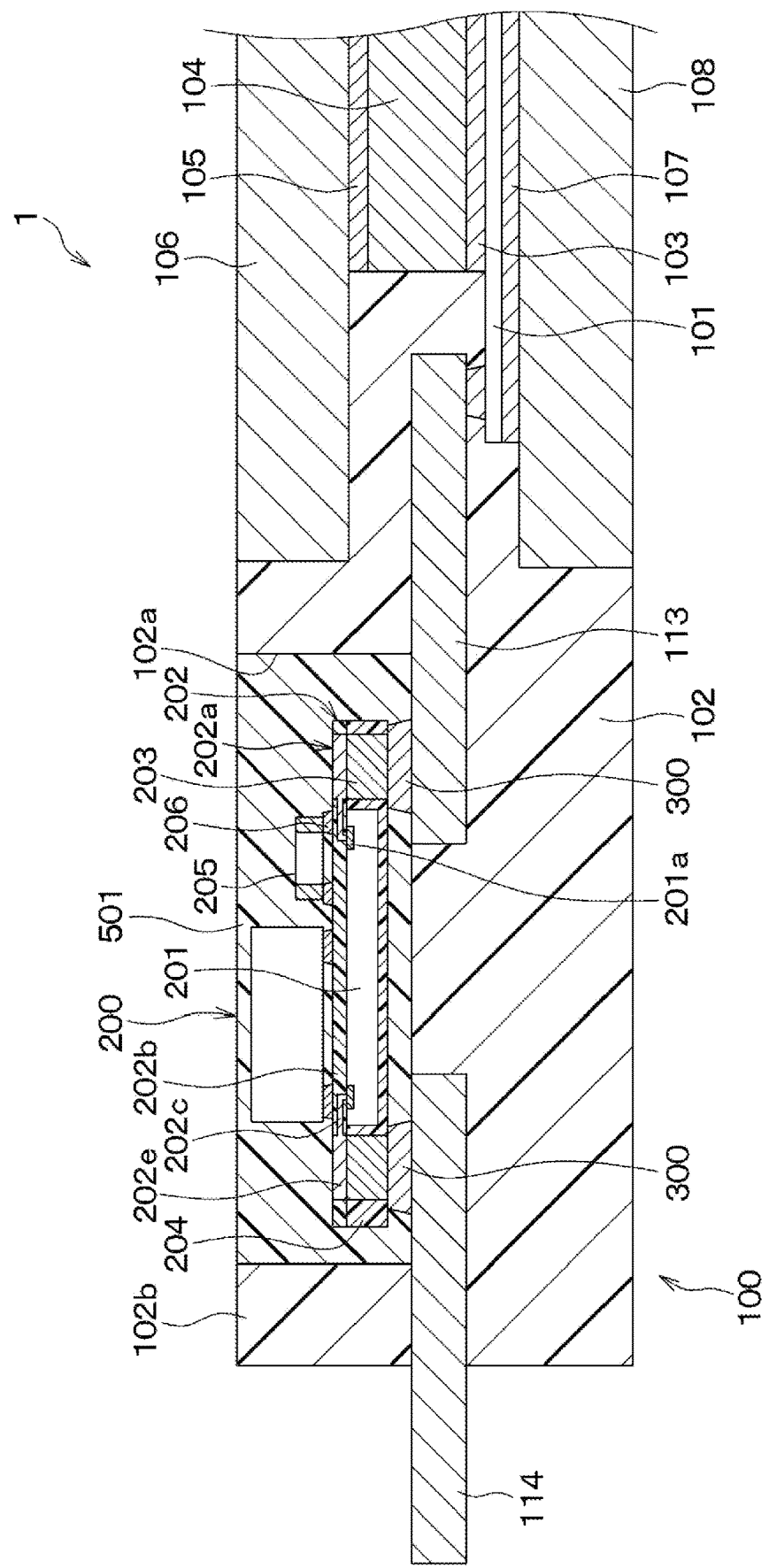

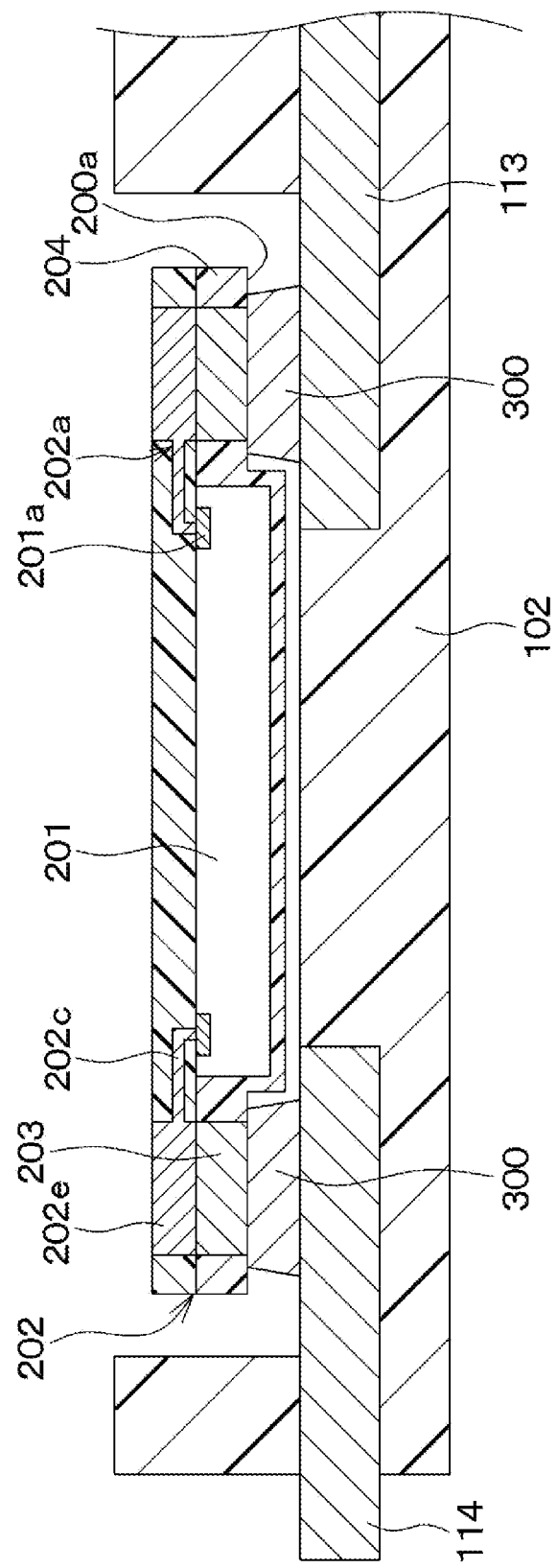

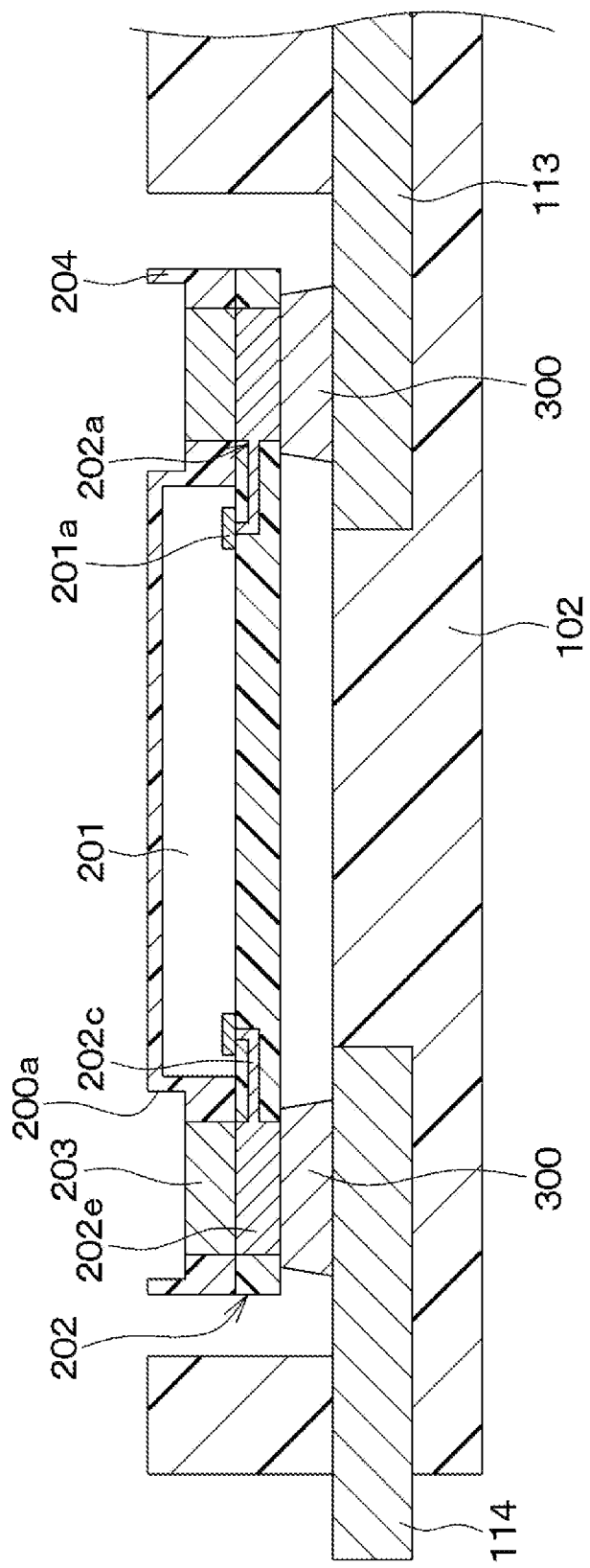

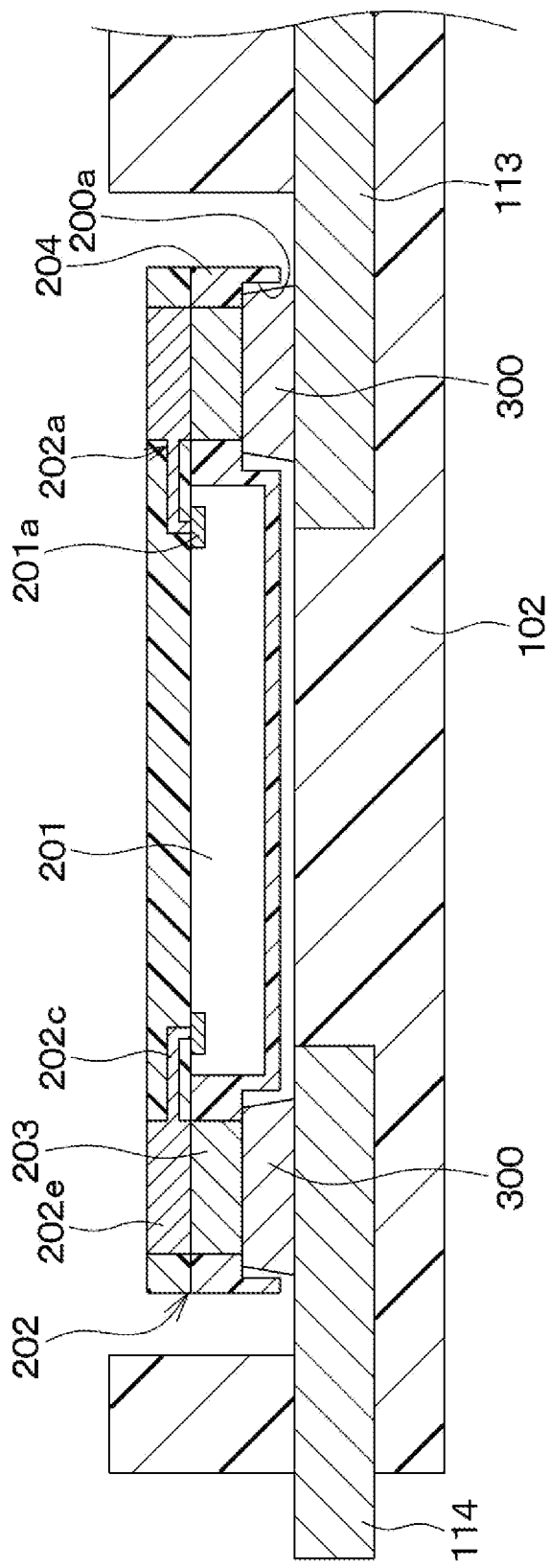

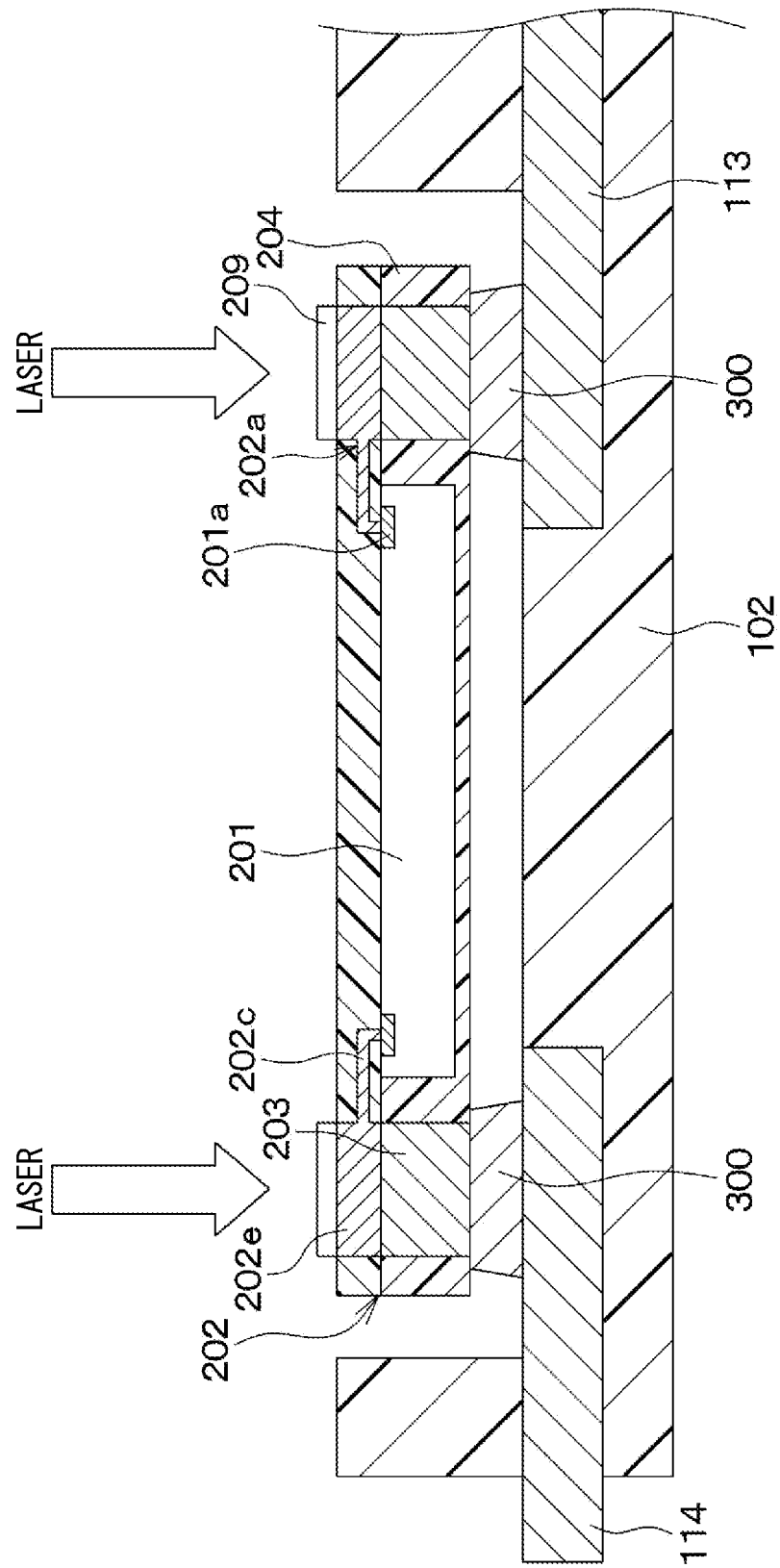

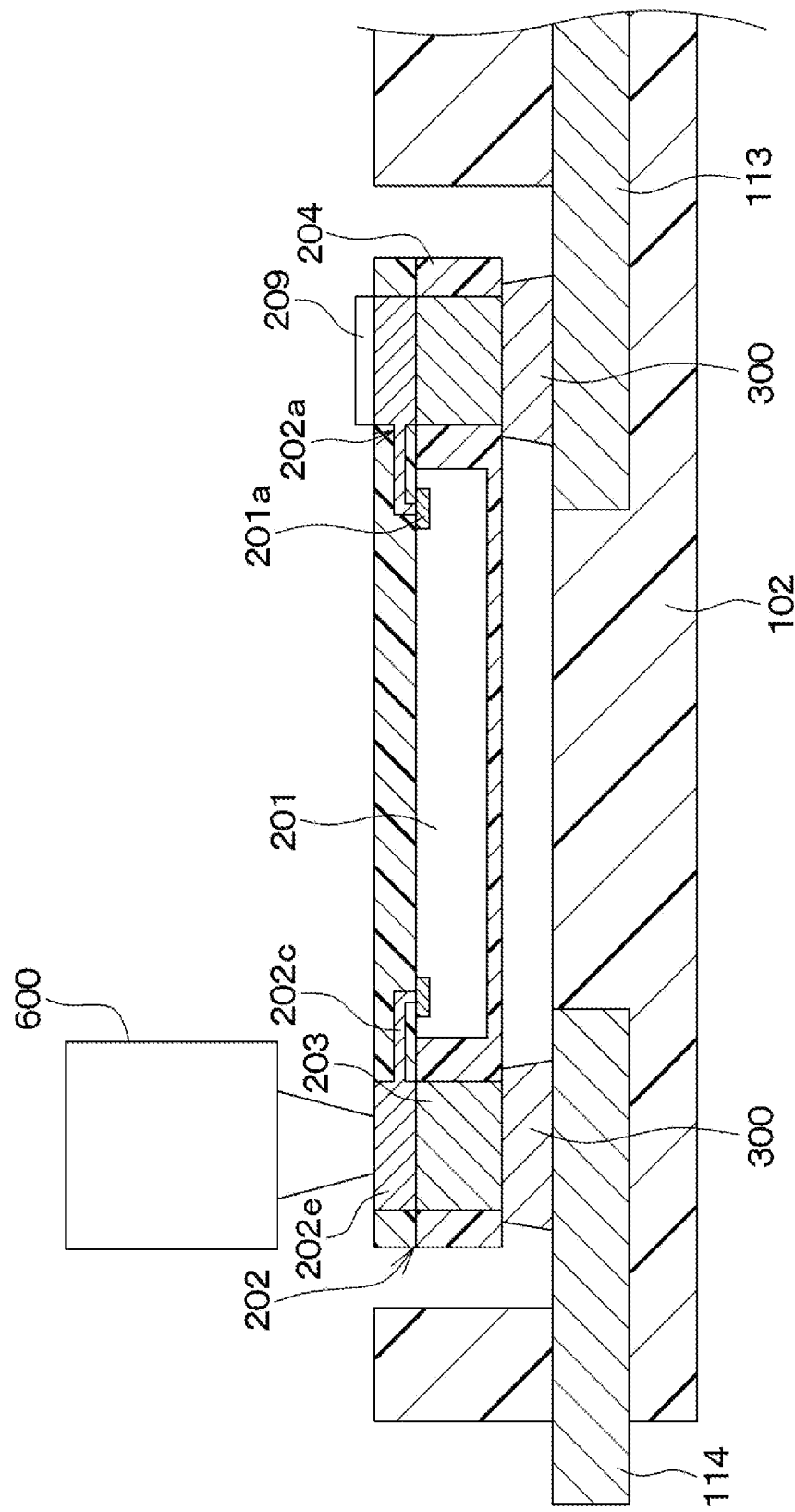

SEMICONDUCTOR DEVICE AND METHOD OF MANUFACTURING THE SAME

CROSS REFERENCE TO RELATED APPLICATION

The present application claims the benefit of priority from Japanese Patent Application No. 2021-094356 filed on Jun. 4, 2021. The entire disclosure of the above application is incorporated herein by reference.

TECHNICAL FIELD

The present disclosure relates to a semiconductor device and a manufacturing method of a semiconductor device.

BACKGROUND

Conventionally, there has been known a semiconductor device in which a circuit package configured by sealing a semiconductor element with a mold resin is electrically connected to a power module configured by sealing a power semiconductor element with a mold resin.

SUMMARY

The present disclosure provides a semiconductor device including a power module, a circuit package, and a joint portion joining the power module and the circuit package. The circuit package includes a semiconductor element, a wiring layer electrically connected with the semiconductor element, a heat conductive member, and a second mold resin portion sealing the semiconductor element and the heat conductive member. The wiring layer includes a connecting portion connected with the heat conductive member. One of the connecting portion or the heat conductive member is joined with a signal wire in the power module via the joint portion. The heat conductive member penetrates the second mold resin portion in a thickness direction of the semiconductor element. The heat conductive member and the connecting portion are arranged in a straight line in the thickness direction of the semiconductor element.

The present disclosure also provides a manufacturing method of the semiconductor device.

BRIEF DESCRIPTION OF DRAWINGS

Objects, features and advantages of the present disclosure will become apparent from the following detailed description made with reference to the accompanying drawings. In the drawings:

FIG. 21 is a cross-sectional view of a semiconductor device described in a modification of the sixth embodiment;

FIG. 22B is a cross-sectional view of a semiconductor device according to another structure of the seventh embodiment;

FIG. 23A is a cross-sectional view of a semiconductor device described in a modification of the seventh embodiment;

FIG. 23B is a cross-sectional view of a semiconductor device described in another modification of the seventh embodiment;

FIG. 26 is a cross-sectional view of a semiconductor device during a manufacturing process according to a ninth embodiment; and FIG. 27 is a cross-sectional view of a semiconductor device during a manufacturing process according to a tenth embodiment.

DETAILED DESCRIPTION

Figure 1:
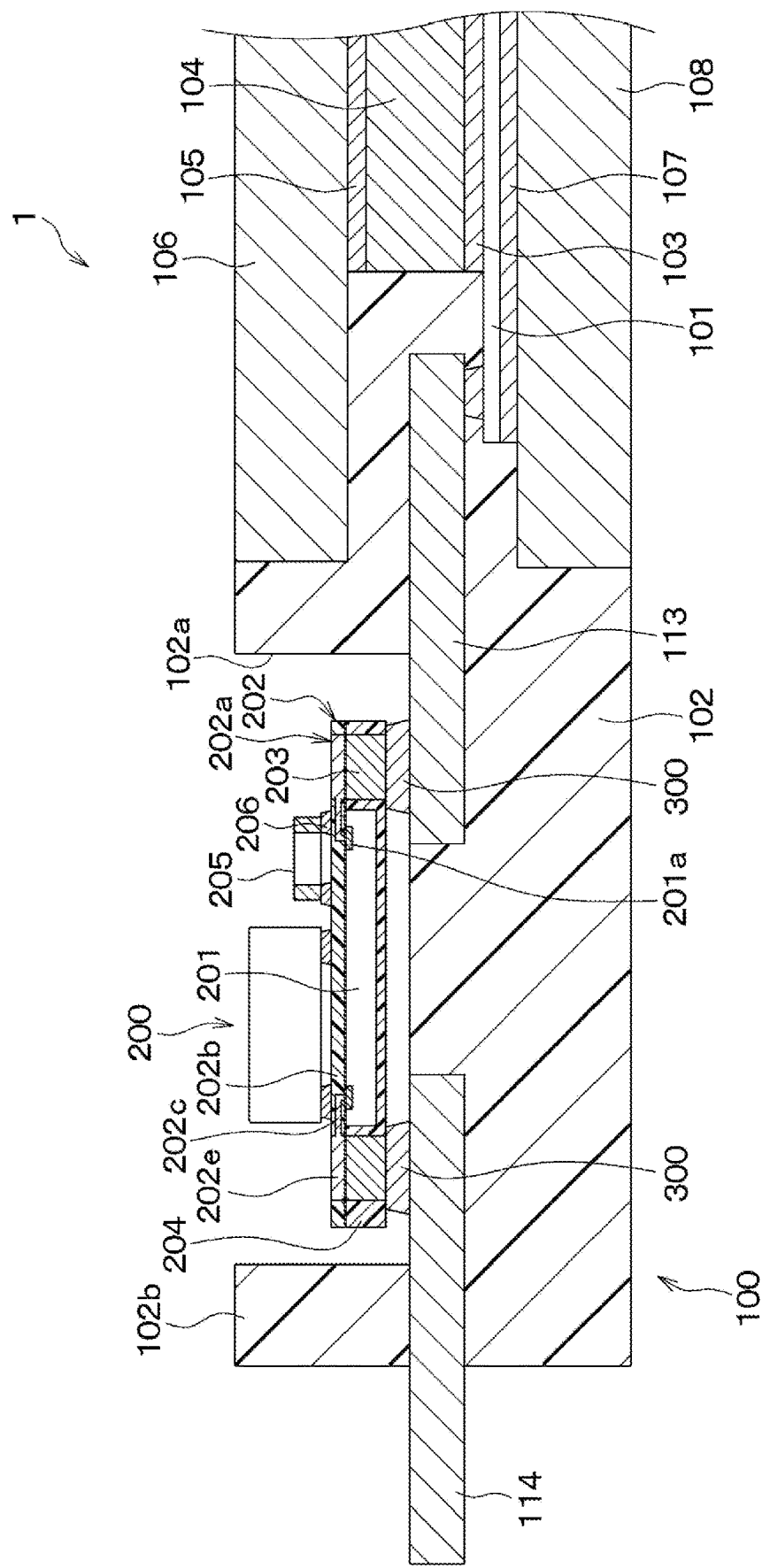
FIG. 1 is a cross-sectional view of a semiconductor device according to a first embodiment.

Next, a relevant technology is described only for understanding the following embodiments. When mounting a circuit package such as a BGA (Ball Grid Array) package, laser irradiation may be used to locally heat a solder between a rear surface of the circuit package and a printed circuit board and join the circuit package and the printed circuit board. Specifically, a mirror unit may be arranged between joint portions of the circuit package and the printed circuit board so that a laser beam emitted from a laser irradiator is guided between the circuit package and the printed circuit board, and the joint portions can be locally heated.

When a circuit package is electrically connected to a power module, a signal wire may be exposed at a position in the power module where the circuit package is to be mounted, and the circuit package may be joined to the signal wire via a joining member such as solder. Specifically, a recess in which the circuit package is to be accommodated may be provided in a mold resin portion of the power module, and the signal wire may be insert-molded in the module resin portion so as to be exposed from a bottom surface of the recess. Then, the circuit package may be disposed in the recess, and a metal wiring of the circuit package may be electrically connected to the signal wire via a joining member such as solder.

However, a heat resistant temperature of the power module is, for example, 150° C. to 200° C. and a melting temperature of the solder is 230° C., and the heat resistant temperature of the power module is lower than the melting temperature of the joining member. Thus, the entire semiconductor device cannot be heated. Therefore, it is necessary to locally heat only the joining member using a laser or the like so that the power module does not exceed the heat resistant temperature.

As a method of locally heating only the joining member, it can be considered that a mirror unit is disposed between joint portions of the circuit package and the power module and the joint portions may be irradiated with a laser beam. However, in a structure in which the circuit package is electrically connected to the power module, a mirror unit cannot be arranged so as to irradiate the joint portions of the circuit package and the power module with a laser beam. For example, since it is necessary to slide a mirror laterally after laser irradiation, it is not possible to arrange tall parts around the circuit package, and it is not possible to provide a wall surface of a recess for accommodating the circuit package. Further, since it is necessary to emit a laser beam aiming at a gap between the power module and the circuit package, a processing process becomes complicated.

According to a first aspect of the present disclosure, a semiconductor device includes a power module, a circuit package, and a joint portion disposed between the power module and the circuit package and joining the power module and the circuit package. The power module includes a power semiconductor element, a signal wire connected to the power semiconductor element, and a first mold resin portion sealing the power semiconductor element and the signal wire while exposing a part of the signal wire. The circuit package includes a semiconductor element, a wiring layer, a heat conductive member, and a second mold resin portion. The wiring layer includes an insulating layer and a metal wiring. The metal wiring is disposed in the insulating layer and is electrically connected to the semiconductor element. The metal wiring includes a connecting portion. The heat conductive member is disposed at a position different from the semiconductor element and is connected with the connecting portion included in the metal wiring. The second mold resin portion seals the semiconductor element and the heat conductive member. One of the connecting portion or the heat conductive member is joined with the signal wire via the joint portion. The heat conductive member penetrates the second mold resin portion in a thickness direction of the semiconductor element. The heat conductive member and the connecting portion are arranged in a straight line in the thickness direction of the semiconductor element.

As described above, in the metal wiring included in the wiring layer in the circuit package, the connecting portion connected with the heat conductive member is arranged with the heat conductive member in the straight line. When the connecting portion is heated by laser irradiation or physical contact with a heating jig, heat can be transferred to the portion to be the joint portion via the metal wiring and the heat conductive member, and these components can be melted. Therefore, the semiconductor device has a structure in which the portion to be the joint portion can be locally heated without emitting a laser beam between the power module and the circuit package.

According to a second aspect of the present disclosure, a manufacturing method of a semiconductor device includes preparing a power module, preparing a circuit package, mounting the circuit package to the power module via a joint portion made of a joining material, and joining the power module and the circuit package by the joint portion. The power module includes a power semiconductor element, a signal wire, and a first mold resin portion. The signal wire is connected to the power semiconductor element, and the first mold resin portion seals the power semiconductor element and the signal wire while exposing a part of the signal wire. The circuit package includes a semiconductor element, a wiring layer, a heat conductive member, and a second mold resin portion. The wiring layer includes an insulating layer and a metal wiring. The metal wiring is disposed in the insulating layer and is electrically connected to the semiconductor element. The metal wiring includes a connecting portion. The heat conductive member is disposed at a position different from the semiconductor element and connected with the connecting portion included in the metal wiring. The second mold resin portion seals the semiconductor element and the heat conductive member. The heat conductive member penetrates the second mold resin portion in a thickness direction of the semiconductor element. The connecting portion and the heat conductive member are arranged in a straight line in the thickness direction of the semiconductor element. The joining of the power module and the circuit package is performed by melting and solidifying the joining material between the circuit package and the power module. The melting of the joining material includes laser irradiation or physical contact with a heating jig to a surface of the circuit package located opposite from the power module to transfer heat to the joint portion through the connecting portion and the heat conductive member.

As described above, in the metal wiring included in the wiring layer of the circuit package, the connecting portion connected to the heat conductive member is arranged with the heat conductive member in the straight line in the thickness direction of the semiconductor element. When the connecting portion is heated by laser irradiation or physical contact with the heating jig, heat can be transferred to the joint portion via the metal wiring and the heat conductive member, and these components can be melted. Therefore, it is possible to locally heat the joint portion without emitting the laser beam between the power module and the circuit package.

Hereinafter, embodiments of the present disclosure will be described with reference to the drawings. In the following embodiments, the same or equivalent parts are denoted by the same reference numerals.

First Embodiment

The following describes a first embodiment. As shown in FIG. 1, a semiconductor device 1 of the present embodiment is configured by mounting a circuit package 200 to a power module 100.

The power module 100 is formed, for example, by integrating a power semiconductor element 101 into a mold resin portion 102 corresponding to a first mold resin portion by insert molding. For example, the power semiconductor element 101 is a MOSFET, an IGBT, or the like that constitutes a switching element constituting an upper arm and a lower arm in an inverter circuit. Here, an example is illustrated in which the power semiconductor element 101 is a vertical element that allows current to flow between first and second surfaces of a semiconductor chip in which the power semiconductor element 101 is disposed.

To the first surface of the power semiconductor element 101, a spacer 104 made of a metal block is joined via a joint portion 103 such as solder. Further, to a side of the spacer 104 opposite from the power semiconductor element 101, a heat sink 106 made of metal is disposed via a joint portion 105 such as solder. On the other hand, to the second surface of the power semiconductor element 101, a heat sink 108 made of metal is disposed via a joint portion 107 such as solder.

Figure 2:
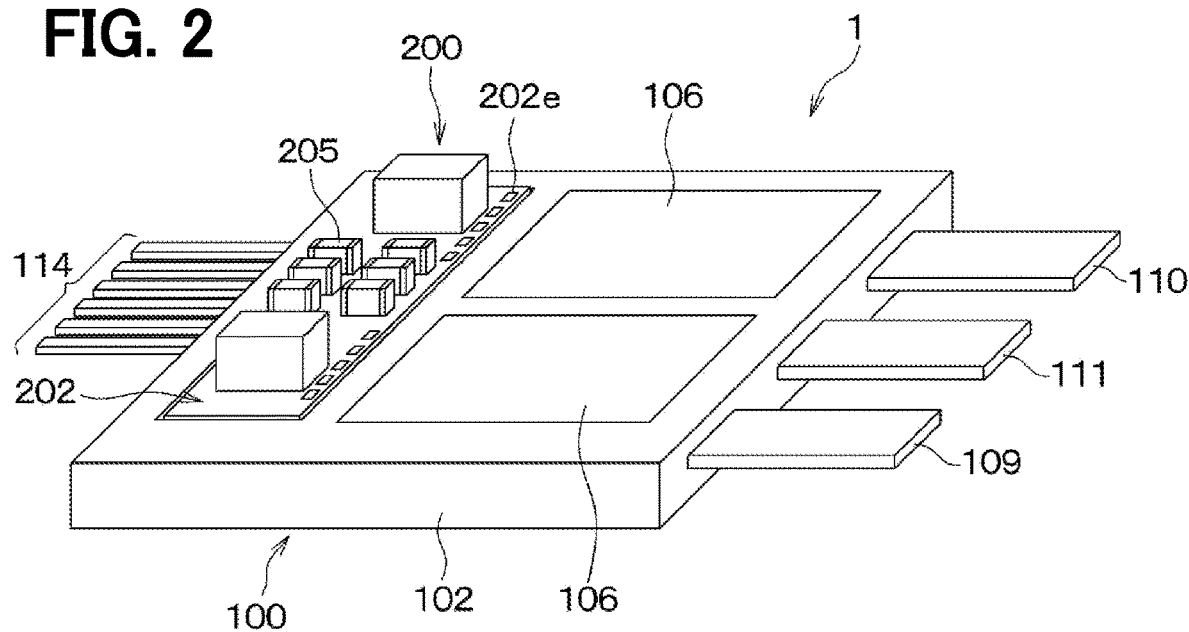
FIG. 2 is a top perspective view of the semiconductor device shown in FIG. 1.

Further, in the semiconductor device 1 of the present embodiment, two power semiconductor elements 101 are arranged side by side, and one power semiconductor element 101 and the other power semiconductor element 101 are connected in series to form an upper arm and a lower arm. Then, from a high potential point, a middle potential point, and a low potential point of the series connection circuit including the two power semiconductor elements 101, a first terminal 109, a second terminal 110, and a third terminal 111 shown in FIG. 2 are respectively drawn out.

Each of the two power semiconductor elements 101 is connected to the heat sinks 106 and 108 provided corresponding to each of the power semiconductor elements 101. Then, each of the heat sinks 106 and 108 is connected to any one of the first terminal 109, the second terminal 110 and the third terminal 111. For example, the two power semiconductor elements 101 are arranged so that the first surfaces face in the same direction and the second surfaces face in the same direction. In that case, the first terminal 109 is connected to the heat sink 108 to which the one power semiconductor element 101 is connected, and the third terminal 111 is connected to the heat sink 106 to which the other power semiconductor element 101 is connected. Then, the second terminal 110 is connected to the heat sink 106 to which the one power semiconductor element 101 is connected and the heat sink 108 to which the other power semiconductor element 101 is connected.

Further, signal wires 113 are respectively connected to multiple pads (not shown) disposed at positions different from the spacer 104 on the first surface of the power semiconductor element 101 via connection portions such as solder. The signal wires 113 are provided for inputting signals to or outputting signals from the power semiconductor element 101. In the present example, five signal wires 113 are provided for each of the power semiconductor elements 101, for example, for controlling a gate voltage or for sensing.

Further, signal wires 114 for inputting signals to or outputting signals from an external board (not shown) are disposed at positions away from the signal wires 113.

The mold resin portion 102 covers and seals the power semiconductor elements 101, the spacers 104, and the like while exposing one surface of each of the heat sinks 106 and one surface of each of the heat sinks 108. The mold resin portion 102 has a recess 102a at a position corresponding to one end of each of the signal wires 113 and one end of each of the signal wires 114, so that the one end of each of the signal wires 113 and the one end of each of the signal wires 114 are exposed on a bottom surface of the recess 102a. Further, the other end of each of the signal wires 114 extends to an opposite side from the signal wires 113 and is drawn out to the outside of the mold resin portion 102 so that the other end of each of the signal wires 114 can be electrically connected to the external board or the like (not shown).

The recess 102a formed in the mold resin portion 102 has a size that can accommodate a circuit package 200 described later. For example, the recess 102a has a rectangular shape with the direction in which the two power semiconductor elements 101 are arranged, that is, the direction in which the heat sinks 106 are arranged in FIG. 2 as a longitudinal direction. Then, as shown in FIG. 1, the signal wires 113 are drawn out from one long side of the recess 102a having the rectangular shape, and the signal wires 114 are drawn out from the other long side. Further, on the bottom surface of the recess 102a, the signal wires 113 and the signal wires 114 are electrically connected with the circuit package 200 via joint portions 300 such as solder.

The depth of the recess 102a may be set optionally. However, in the present embodiment, the depth of the recess 102a is made greater than the height of the joint portions 300 so that the joint portions 300 can enter the recess 102a. Therefore, even if an attempt is made to emit a laser beam or the like between the circuit package 200 and the bottom surface of the recess 102a, the laser beam is blocked by a wall surface 102b or the like around the recess 102a so that the laser beam cannot reach a portion between the circuit package 200 and the bottom surface of the recess 102a.

The circuit package 200 is a package of an electric circuit including a semiconductor element 201, for example, a drive circuit of the power semiconductor elements 101. In the present embodiment, the circuit package 200 includes the semiconductor element 201, a wiring layer 202, heat conductive members 203, a mold resin portion 204, and electronic components 205.

The semiconductor element 201 is configured, for example, by forming various elements for controlling the drive of the power semiconductor elements 101 to a semiconductor chip. The semiconductor element 201 has multiple pads 201a on a surface adjacent to the wiring layer 202 so as to be electrically connected to desired portions of the wiring layer 202.

The wiring layer 202 includes a metal wiring 202a that is electrically connected to the semiconductor element 201 and the electronic components 205. The outer shape of the circuit package 200 is formed by the wiring layer 202 and the mold resin portion 204, and here, the wiring layer 202 has a rectangular shape corresponding to the recess 102a. In the present embodiment, the circuit package 200 is arranged in the recess 102a in such a manner that the semiconductor element 201 and the mold resin portion 204 face the bottom surface of the recess 102a and the wiring layer 202 faces the outside of the recess 102a. Further, the electronic components 205 are arranged on one surface of the wiring layer 202 opposite from the semiconductor element 201 and the mold resin portion 204. Although a connection state does not appear in the drawings, the metal wiring 202a exposed from the one surface and the electronic components 205 are electrically connected via joint portions 206 such as solder.

Figure 3:
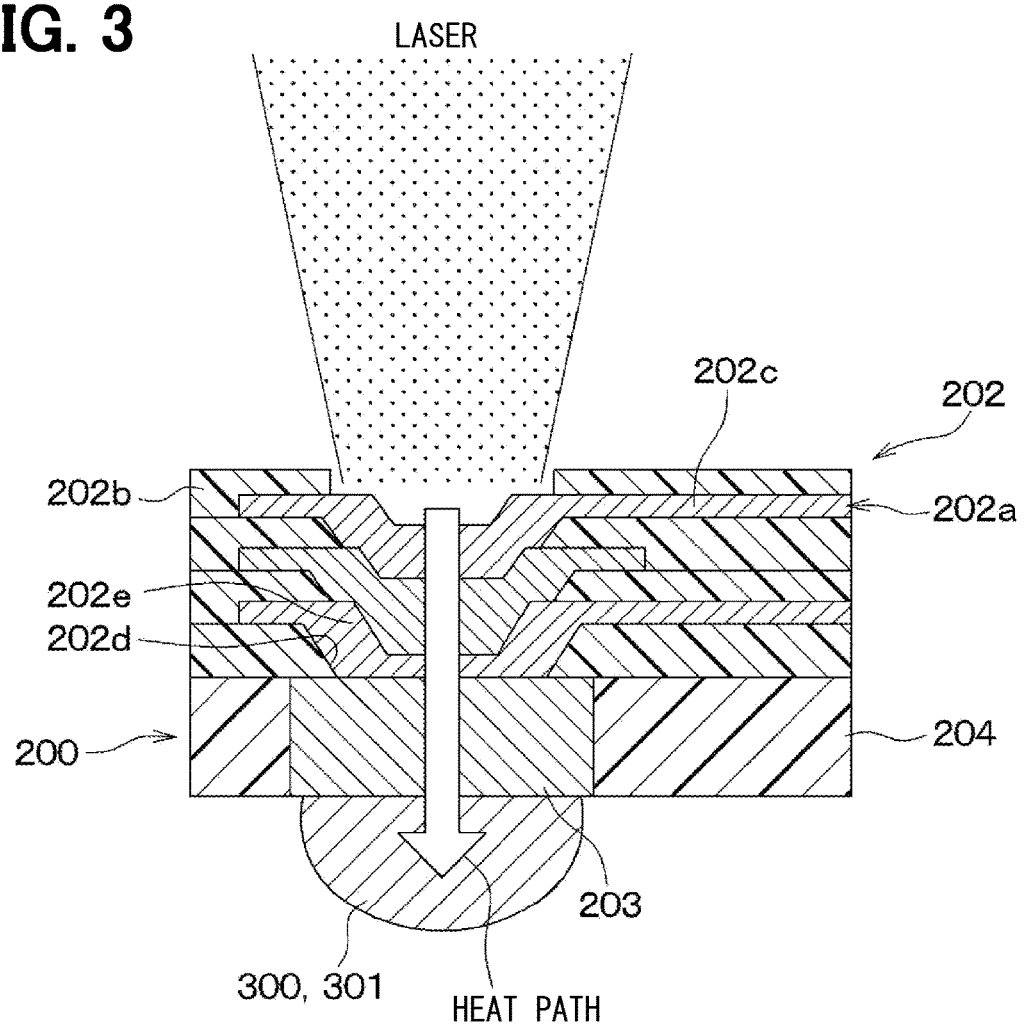
FIG. 3 is a cross-sectional view showing a state of joining by laser irradiation.

In the present embodiment, as shown in FIG. 3, the wiring layer 202 has a multi-layer structure in which an insulating layer 202b, a metal wiring layer 202c having a desired pattern, and the like are repeatedly laminated. The metal wiring 202a is formed by connecting desired portions of the metal wiring layers 202c of each layer. Further, at a position corresponding to each of the heat conductive members 203 in the wiring layer 202, a connecting portion 202e is formed by providing an opening portion 202d in each of the insulating layers 202b, and embedding the opening portion 202d with a metal wiring layer 202c, a plating layer, or the like. The metal wiring 202a is composed of the connecting portion 202e and the metal wiring layer 202c. The connecting portions 202e of respective layer are connected in a row, and the connecting portions 202e of each layer and corresponding one of the heat conductive members 203 are connected in a straight line. Further, one surface of the connecting portion 202e located opposite from corresponding one of the heat conductive members 203 is exposed from the insulating layer 202b.

The shape of each of the connecting portions 202e may be set optionally and may be formed according to the shape of the heat conductive members 203 described later. For example, an upper surface shape seen from the normal direction with respect to the surface of the semiconductor element 201 may be a circle or a polygon such as a quadrangle. When each of the connecting portions 202e has a circular shape, it is preferable that a diameter of each of the connecting portions 202e is 0.5 mm or more. Further, when each of the connecting portions 202e is a polygon, it is preferable that the size is equal to or larger than the size in which a circle having a diameter of 0.5 mm can be included inside the polygon. Note that FIG. 2 shows a case where the upper surface shape of each of the connecting portions 202e is a quadrangle.

The heat conductive members 203 are disposed so as to penetrate the mold resin portion 204 in the thickness direction of the semiconductor element 201. The heat conductive members 203 are made of a material having a higher heat conductivity than the constituent material of the mold resin portion 204. The heat conductive members 203 play a role of transferring heat to the joint portions 300 together with the connecting portions 202e. Further, the heat conductive members 203 can conduct current. In the present embodiment, the heat conductive members 203 are made of only a metal such as Cu (copper), Al (aluminum), and Ag (silver), but a material other than the metal may be contained.

The shape of the heat conductive members 203 may be set optionally. For example, an upper surface shape seen from the normal direction with respect to the surface of the semiconductor element 201 is a cylinder or a polygonal prism. The lateral dimension of each of the heat conductive members 203, that is, the shortest dimension in the direction orthogonal to the thickness direction of the semiconductor element 201 while passing through a central axis of each of the heat conductive members 203 may also be set optionally, but is preferably 0.5 mm or more. When each of the heat conductive members 203 has a cylindrical shape, it is preferable that the diameter of the heat conductive member 203 is 0.5 mm or more. Further, when each of the heat conductive members 203 has a polygonal prism shape, it is preferable that the size is equal to or larger than the size in which a cylinder having a diameter of 0.5 mm can be included inside the polygonal prism.

The heat conductive members 203 are formed from a surface of the mold resin portion 204 adjacent to the wiring layer 202 to an opposite surface of the mold resin portion, that is, a surface adjacent to the bottom surface of the recess 102a. The thickness of each of the heat conductive members 203 may be set optionally. In the present embodiment, the thickness of each of the heat conductive members 203 is same as the thickness of the mold resin portion 204, and is, for example, 0.5 mm. Then, one surface of each of the heat conductive members 203 adjacent to the wiring layer 202 is connected to one of the connecting portions 202e. Further, another surface of each of the heat conductive members 203 adjacent to the bottom surface of the recess 102a is connected to corresponding one of the joint portions 300, so that the each of heat conductive members 203 is electrically connected to corresponding one of the signal wires 113 or the signal wires 114.

The mold resin portion 204 corresponds to a second mold resin portion, covers and seals the semiconductor element 201 arranged on one surface of the wiring layer 202. The mold resin portion 204 is made of, for example, an epoxy resin. The mold resin portion 204 covers and protects the semiconductor element 201 and has a thickness of about 0.2 mm to 1 mm. In the present embodiment, the mold resin portion 204 has a thickness of 0.5 mm, and the entire region of the mold resin portion 204 has the same thickness. Further, the mold resin portion 204 has the same dimensions and shape as the wiring layer 202 when viewed from the thickness direction of the semiconductor element 201. In the present embodiment, the mold resin portion 204 has a rectangular shape. Then, the heat conductive members 203 are arranged and insert-molded along the long sides of the mold resin portion 204. In other words, in the cross section of FIG. 1, the heat conductive members 203 are embedded on both sides of the mold resin portion 204 sandwiching the semiconductor element 201, that is, at the positions corresponding to the signal wires 113 and the positions corresponding to the signal wires 114.

The electronic components 205 are passive components such as chip capacitors, semiconductor components different from the semiconductor element 201, or the like. FIGS. 1 and 2 show an example in which the electronic components 205 are chip capacitors. However, the electronic components 205 may be components other than the chip capacitors. In the present embodiment, the circuit package 200 includes the electronic components 205. However, the circuit package 200 does not have to include the electronic components 205.

The power module 100 and the circuit package 200 are configured as described above. The semiconductor device 1 of the present embodiment is configured by electrically connecting the power module 100 and the circuit package 200 configured as described above via the joint portions 300.

Subsequently, the manufacturing method of the semiconductor device 1 of the present embodiment will be described with reference to FIGS. 4A to 4C.

Figure 4A:
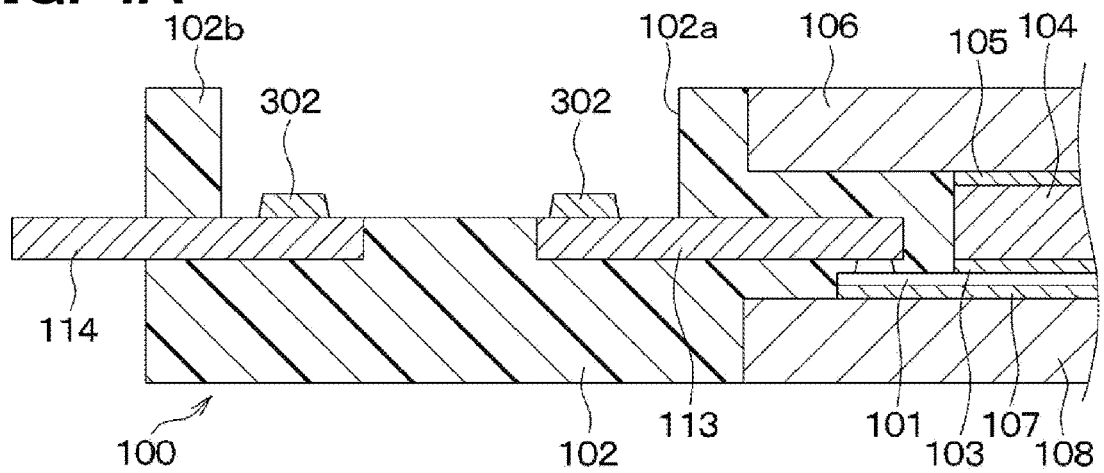
FIGS. 4A to 4C are diagrams showing manufacturing processes of the semiconductor device shown in FIG. 1.

First, as shown in FIG. 4A, the power module 100 configured as described above is prepared. In the power module 100, the power semiconductor elements 101, the spacers 104, the heat sinks 106, the heat sinks 108, the signal wires 113, and the signal wires 114 are inserted-molded in the mold resin portion 102. The recess 102a may be formed in the mold resin portion 102 at the time of insert molding, but the recess 102a may be formed after molding by grinding or the like. Then, a joining material 301 such as a solder paste that becomes a part of the joint portions 300 is applied on the signal wires 113 and the signal wires 114. Here, the joining material 301 is a solder paste, but solder other than the paste, a sintered material, a conductive paste other than the solder, or the like may be used.

Figure 4B:
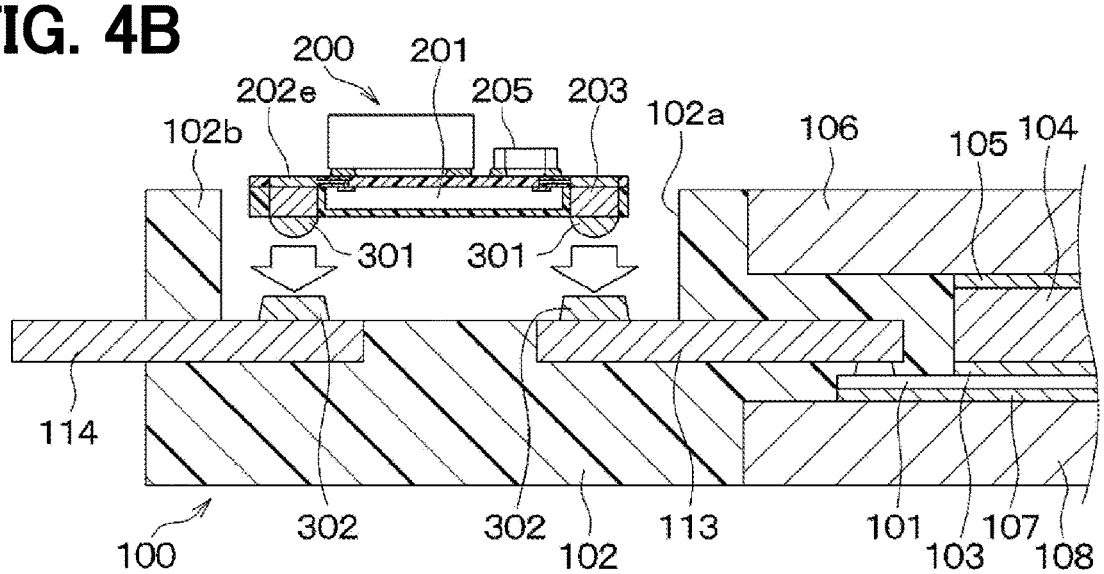
Figure 4C:
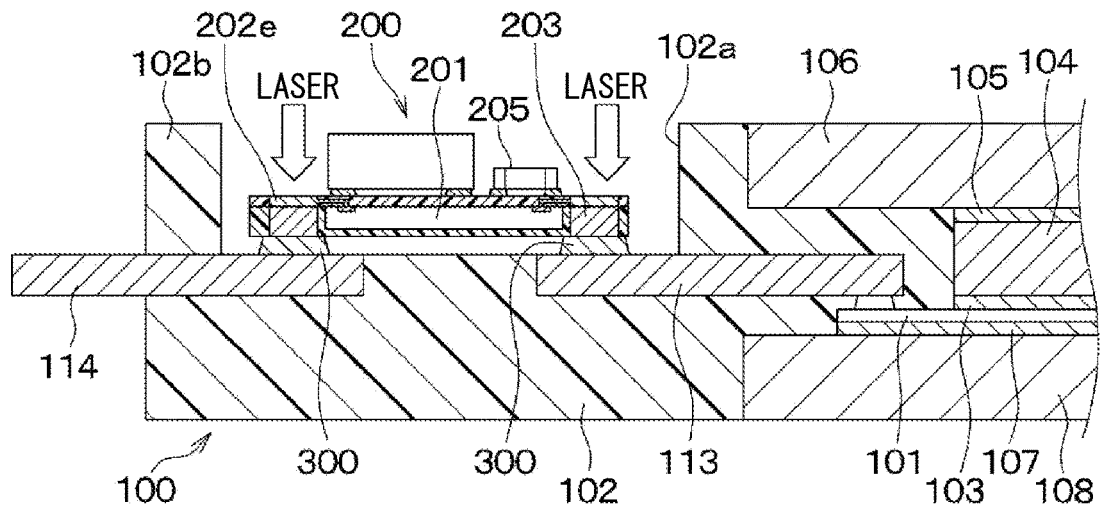

Subsequently, as shown in FIG. 4B, the circuit package 200 configured as described above is prepared. In the circuit package 200, the semiconductor element 201 and the heat conductive members 203 are arranged on the one surface of the wiring layer 202, these components are covered with the mold resin portion 204, and the electronic components 205 are mounted on the other surface of the wiring layer 202. A joining material 302 such as a solder bump is arranged on the surface of each of the heat conductive members 203 exposed from the mold resin portion 204. The joining material 302 is a part of the joint portions 300.

Then, as shown by arrows in FIG. 4B, the circuit package 200 is moved into the recess 102a of the mold resin portion 102 in the power module 100, and the circuit package 200 is mounted on the power module 100. After that, as shown in FIG. 4C, laser irradiation is performed from a surface side of the circuit package 200 opposite to the power module 100. The joining material 301 and the joining material 302 are melted by local heating using the laser irradiation, and then solidified by natural cooling or the like, so that the power module 100 and the circuit package 200 are electrically connected via the joint portions 300.

At this time, local heating by the laser irradiation is performed by irradiating the connecting portions 202e of the circuit package 200 with laser beams as shown in FIG. 3. In this way, as shown by the arrows in FIG. 3, heat is transferred through the connecting portion 202e of each layer and the heat conductive member 203 connected in the straight line to melt the joining material 301 and the joining material 302.

As described above, in the present embodiment, the connecting portions 202e forming a part of the metal wiring 202a provided in the wiring layer 202 of the circuit package 200 are arranged in the straight line with the corresponding one of the heat conductive members 203. Then, a part of the connecting portions 202e is exposed from the wiring layer 202. Therefore, when the exposed part of the connecting portions 202e is irradiated with a laser beam, heat can be transferred to the joining material 301 and the joining material 302 via the connecting portions 202e and the heat conductive member 203, and the joining material 301 and the joining material 302 are melted. Therefore, it is possible to locally heat the portions to be the joint portions 300 without emitting the laser beam between the power module 100 and the circuit package 200. Therefore, even if the heat resistant temperature of the power module 100 is as low as 150° C. to 200° C., the joining material 301 and the joining material 302 can be heated to 230° C. or higher without increasing the temperature of the power module 100 to the heat resistant temperature or higher.

Figure 5:
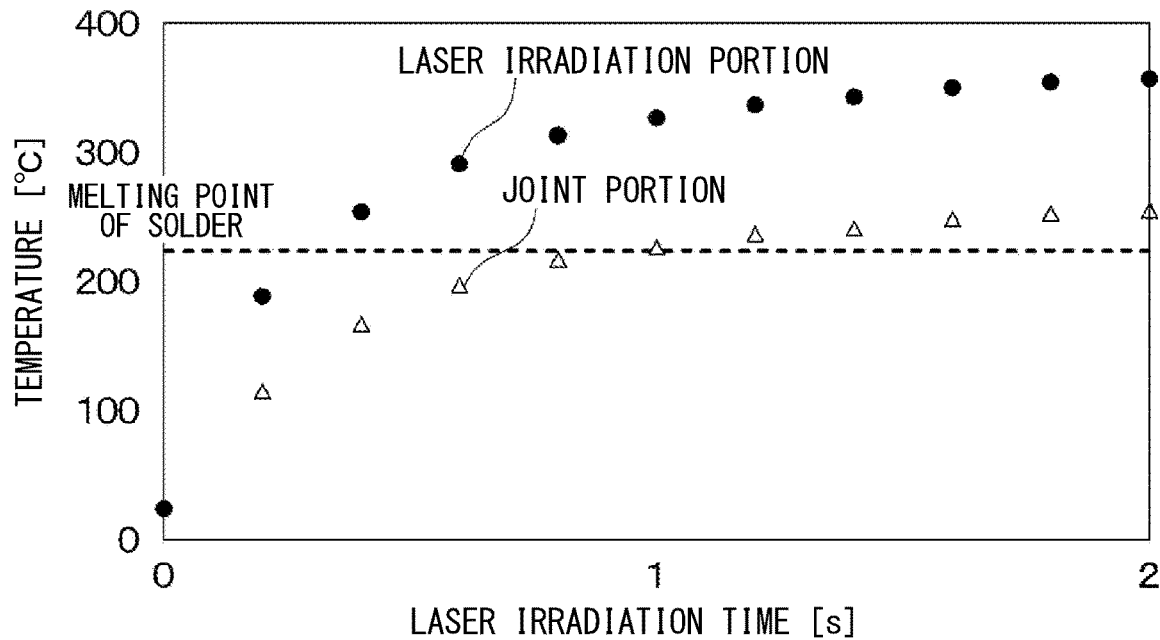
FIG. 5 is a diagram showing a relationship between temperatures of a laser irradiation portion and a joint portion during laser irradiation and a laser irradiation time.

As a reference, when the temperature of the exposed portion of the connecting portions exposed from the wiring layer 202, that becomes a laser irradiation portion, and the portion serving as the joint portion 300 were measured during laser irradiation, the results shown in FIG. 5 were obtained. As shown in FIG. 5, when the temperature of the laser irradiation portion exceeds 300° C. and rises to about 350° C., the temperature of the portion to be the joint portion 300 also exceeds 230° C. That is, when the connecting portions 202e are irradiated with laser beams, the portions to be the joint portions 300 can be heated to a temperature equal to or higher than the melting point temperature through the connecting portions 202e and the heat conductive members 203. Therefore, when the connecting portions 202e and the heat conductive members 203 are arranged in straight lines, and laser irradiation is performed from a direction opposite from the joint portions 300 as in the present embodiment, the joint portions 300 can be locally heated and the power module 100 and the circuit package 200 can be joined while suppressing heating of the power module 100.

Further, in the semiconductor device 1 of the present embodiment, the following effects can be obtained.

As described above, the lateral dimensions of the connecting portions 202e and the heat conductive members 203 can be set optionally. However, when each of the connecting portions 202e or each of the heat conductive members 203 has a circular shape, it is preferable that the diameter is 0.5 mm or more. When each of the connecting portions 202e or each of the heat conductive members 203 has a polygonal shape, it is preferable that the size is equal to or larger than the size in which a circle having a diameter of 0.5 mm can be included inside the polygonal shape.

When laser irradiation is performed, the laser diameter is generally 0.5 mm, but if the dimensions of the connecting portion 202e and the heat conductive member 203 are smaller than the laser diameter, the laser irradiation may be performed also to a portion of the wiring layer 202 other than the connecting portions 202e. In that case, the portion other than the connecting portions 202e to which the laser irradiation is performed becomes a high temperature, which may cause thermal damage. Therefore, by setting the connecting portions 202e and the heat conductive members 203 to the above-described dimensions, it is possible to suppress the laser irradiation from being performed to a portion other than the connecting portions 202e, and it is possible to suppress the occurrence of thermal damage.

Further, the heat conductive members 203 are made of a metal such as Cu, Al, or Ag. These metals have high heat conductivity, and when the connecting portions 202e are irradiated with a laser beam, heat can be efficiently transferred to the joint portions 300.

Figure 6:
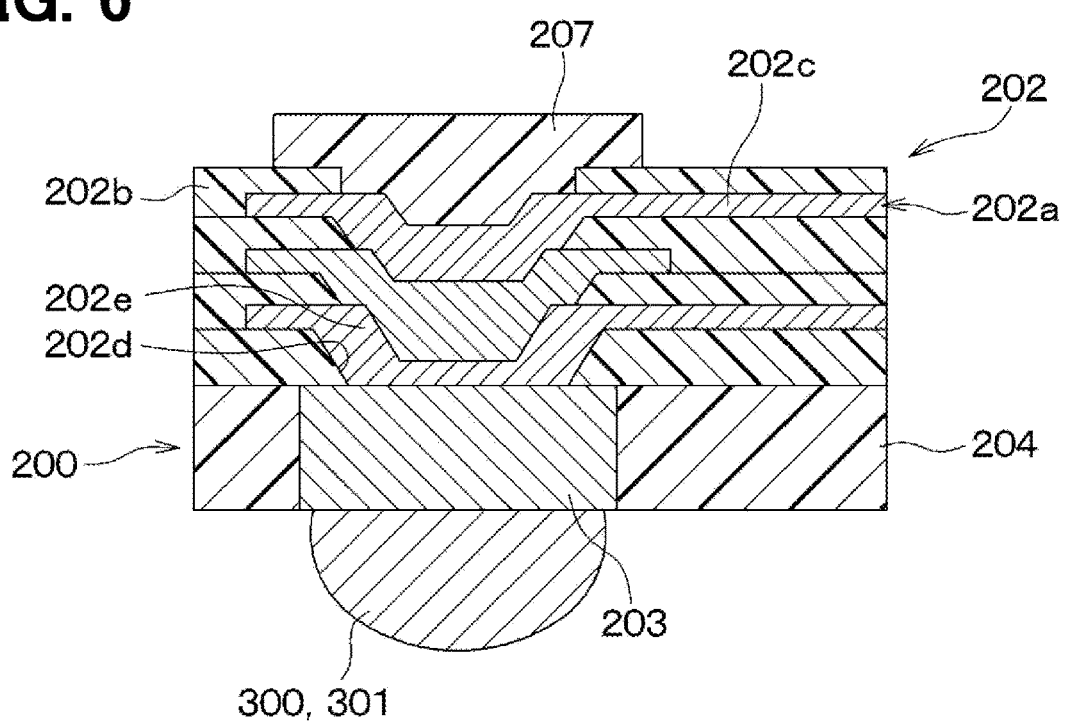
FIG. 6 is a cross-sectional view of a metal wiring in a case where an exposed portion is covered and sealed with an insulating material.

The connecting portions 202e are exposed from the insulating layer 202b since the connecting portions 202e are portions where laser irradiation is performed. However, the exposed surfaces of the connecting portions 202e may be covered with an insulating material 207 after the laser irradiation, as shown in FIG. 6. When the exposed surfaces of the connecting portions 202e are sealed with the insulating material 207 in this way, the metal wiring 202a including the connecting portions 202e can be insulated from the outside, and the reliability of the semiconductor device 1 can be further improved.

Second Embodiment

The following describes a second embodiment. In the present embodiment, the orientation of the circuit package 200 is changed from the first embodiment, and the remaining configurations are the same as those in the first embodiment. Therefore, only portions different from the first embodiment will be described.

Figure 7:
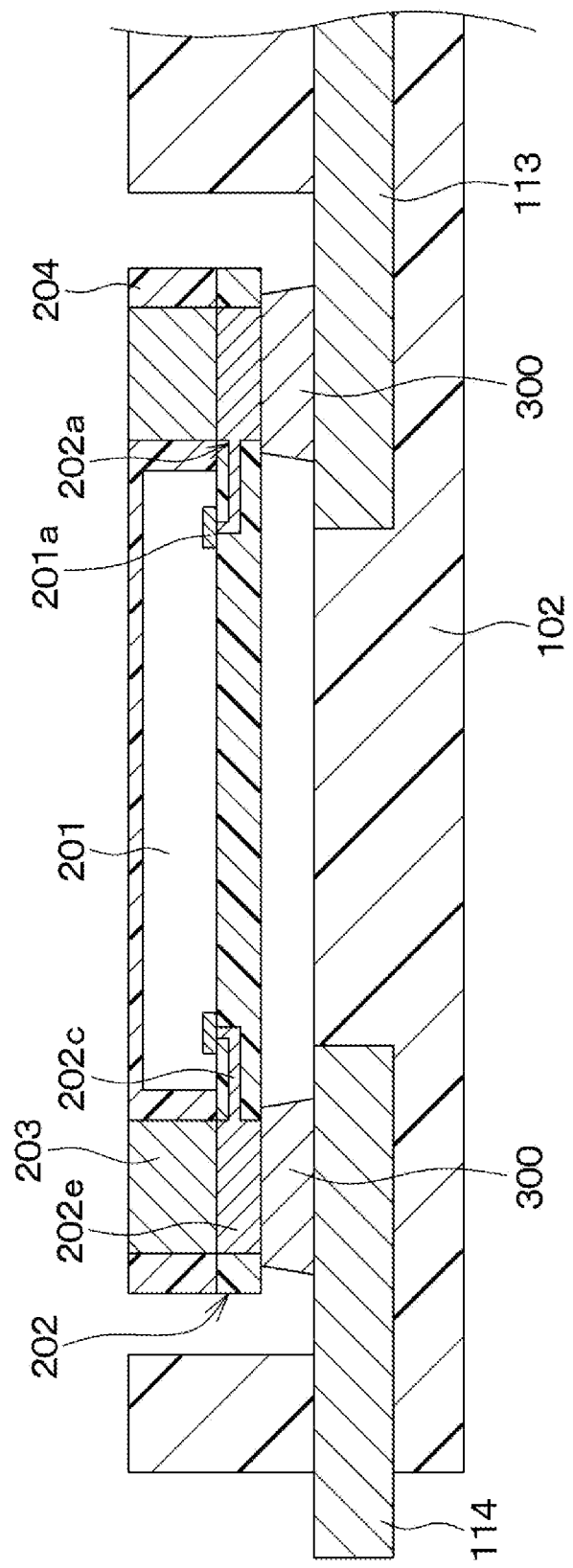
FIG. 7 is a partial cross-sectional view of a semiconductor device according to a second embodiment.

As shown in FIG. 7, in the present embodiment, the circuit package 200 is disposed in the recess 102a so that the wiring layer 202 faces the bottom surface of the recess 102a and the semiconductor element 201 and the mold resin portion 204 face the outside of the recess 102a. That is, when the circuit package 200 is disposed in the recess 102a, the heat conductive members 203 are exposed, and the connecting portions 202e are joined to the signal wires 113 or the signal wires 114 via the joint portions 300.

Figure 8:
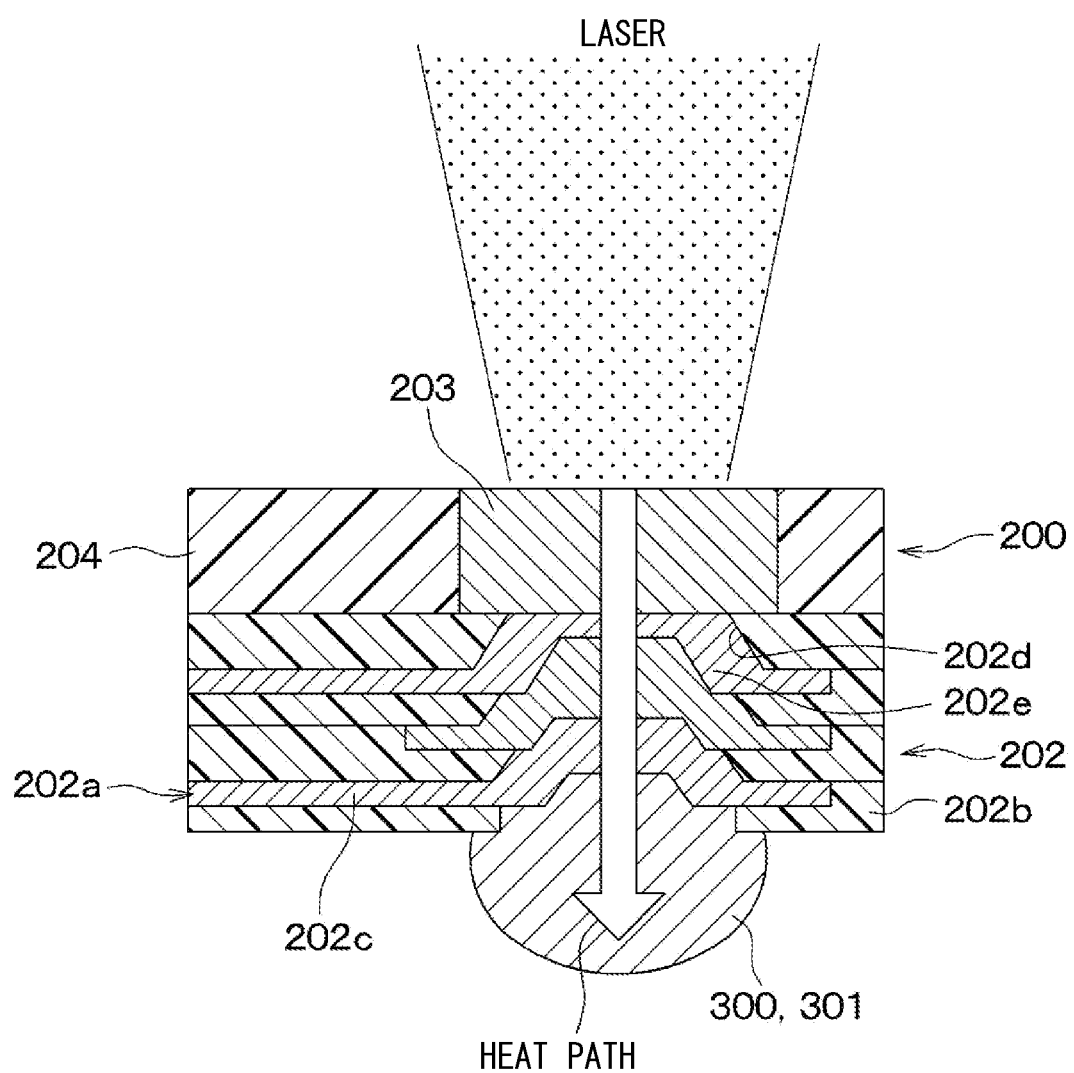
FIG. 8 is a cross-sectional view showing a state of joining by laser irradiation.

Even in such a configuration, as shown in FIG. 8, the connecting portion 202e of each layer and the heat conductive member 203 are connected side by side on a straight line. Therefore, when the heat conductive member 203 is irradiated with the laser beam, the portions to be the joint portions 300 can be locally heated through the heat conductive members 203 and the connecting portions 202e. Accordingly, effects similar to the effects of the first embodiment can be achieved.

Also in this case, the heat conductive members 203 are exposed from the insulating layer 202b since the heat conductive members 203 are portions where the laser irradiation is performed. However, the exposed surfaces of the heat conductive members 203 may be covered and sealed with an insulating member after the laser irradiation. When the exposed surfaces of the heat conductive members 203 are sealed with the insulating material in this way, the metal wiring 202a including the heat conductive members 203 can be insulated from the outside, and the reliability of the semiconductor device 1 can be further improved.

Third Embodiment

The following describes a third embodiment. In the present embodiment, the dimensions of the heat conductive members 203 included in the circuit package 200 are defined with respect to the first and second embodiments, and the remaining configurations are the same as those in the first and second embodiments. Therefore, only portions different from the first and second embodiments will be described. Although a case where the dimensions of the heat conductive members 203 are defined with respect to the configuration of the first embodiment will be described here, the same applies to the configuration of the second embodiment.

Figure 9:
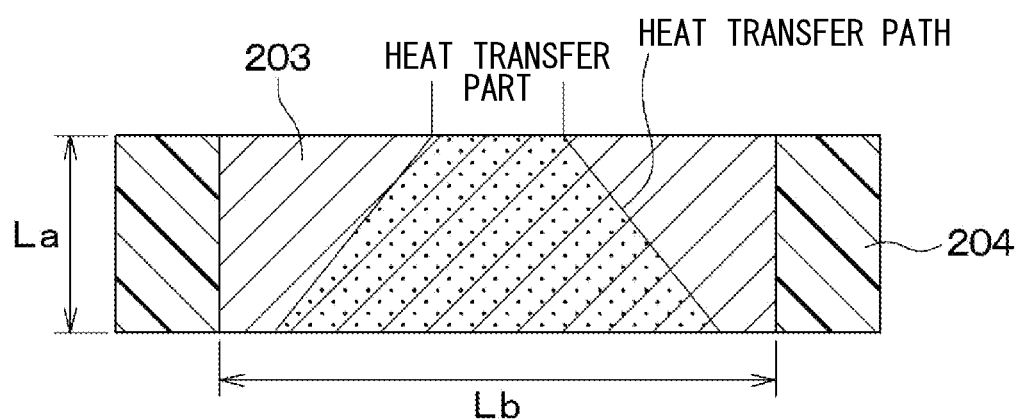
FIG. 9 is a cross-sectional view of the vicinity of a heat conductive member provided in a semiconductor device according to a third embodiment.

In the present embodiment, as shown in FIG. 9, each of the heat conductive members 203 has a flat shape. When the thickness having the same direction as the thickness direction of the semiconductor element 201 and the mold resin portion 204 is La, and the lateral dimension orthogonal to the thickness direction is Lb, La<Lb. For example, when the thickness La of the mold resin portion 204 is 0.5 mm as described above, the lateral dimension Lb is 1.0 mm or more. The lateral dimension Lb referred to here means the shortest dimension of each of the heat conductive members 203 in a direction orthogonal to the thickness direction of the semiconductor element 201 while passing through the central axis of each of the heat conductive members 203. When each of the heat conductive member 203 has a cylindrical shape, the diameter is the lateral dimension Lb. When each of the heat conductive members 203 is a regular polygonal prism, the distance between the two opposite sides is the lateral dimension Lb.

Figure 10:
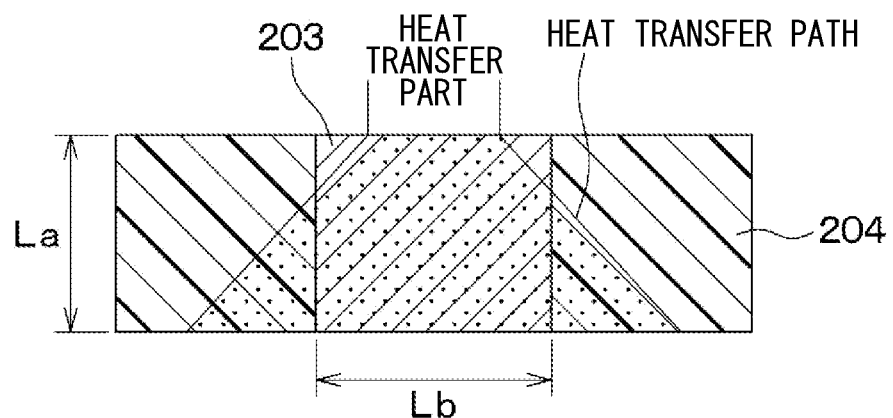
FIG. 10 is a cross-sectional view of the vicinity of a heat conductive member in a case where a lateral dimension of the heat conductive member is equal to or less than a thickness of the heat conductive member.
Figure 11:
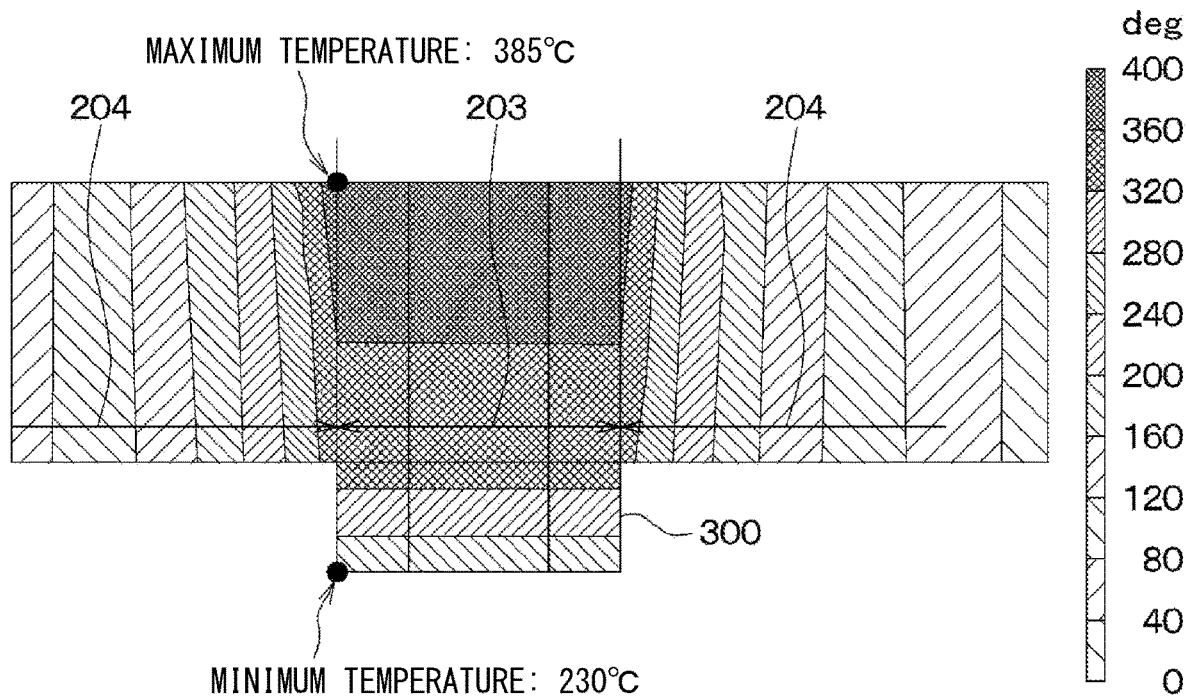
FIG. 11 is a temperature distribution diagram at the time of laser irradiation in a case of the structure shown in FIG. 10.

As shown in FIG. 10, when the lateral dimension Lb is equal to or less than the thickness La, heat is transferred in the thickness direction from a side adjacent to the connecting portions 202e to which the laser irradiation is performed while being diffused and spread. Specifically, the heat transfer path diffuses heat at an angle of 45°, as shown in FIG. 10. Therefore, as shown in FIG. 11, the temperature of the mold resin portion 204 around the heat conductive member 203 becomes high, and in particular, the temperature becomes the maximum at a portion of the mold resin portion 204 closest to the connecting portion 202e. According to a simulation by the inventors, in order to heat the joint portion 300 to 230° C., which is the melting temperature of the solder, it is necessary to perform laser irradiation with a laser diameter of φ0.5 mm at 6.8 W for 1 second. In that case, it was confirmed that the temperature at the portion of the mold resin portion 204 closest to the connecting portion 202e is increased to 385° C. Therefore, when the lateral dimension Lb is equal to or less than the thickness La, there is a concern about thermal damage to the mold resin portion 204.

Figure 12:
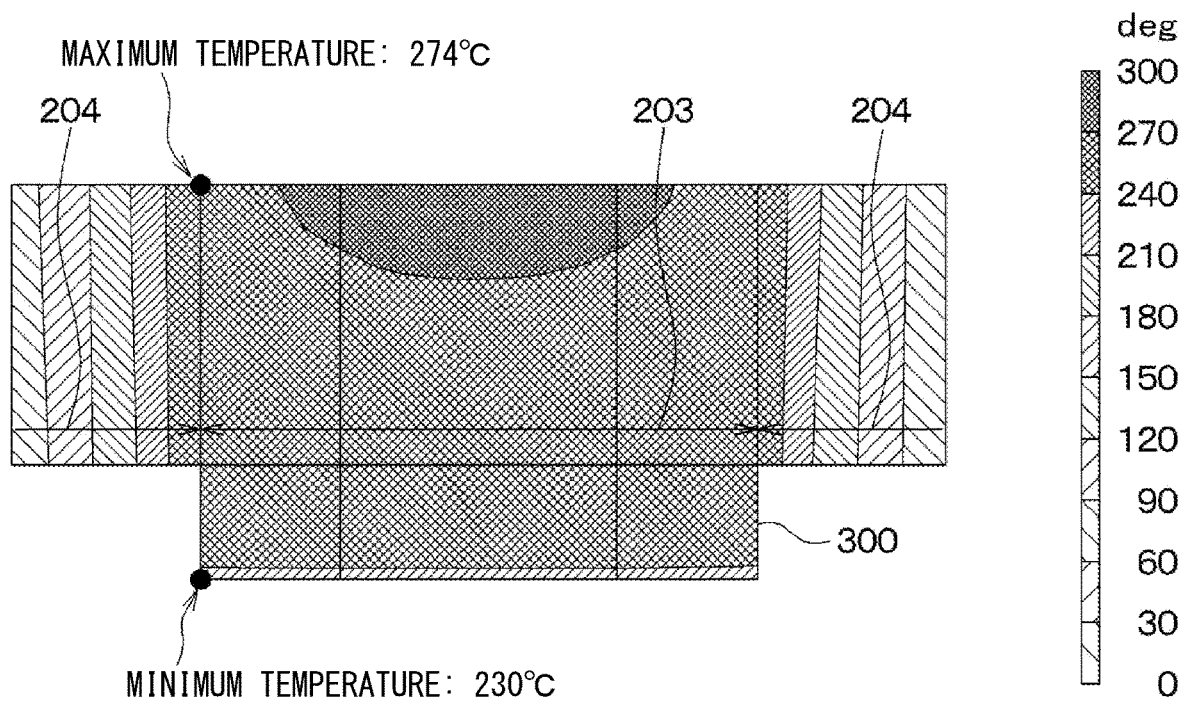
FIG. 12 is a temperature distribution diagram at the time of laser irradiation in a case of the structure shown in FIG. 9.

On the other hand, in the present embodiment, the heat conductive member 203 has a flat shape in which the lateral dimension Lb is larger than the thickness La. With such dimensions, even if heat is diffused from the side adjacent to the connecting portion 202e, which is irradiated with the laser beam, toward the thickness direction, the heat diffusion can be accommodated inside the heat conductive member 203. According to a simulation by the inventors, in order to heat the joint portion 300 to 230° C., which is the melting temperature of the solder, it is necessary to perform laser irradiation with a laser diameter of φ0.5 mm at 5.7 W for 1 second. However, even when such laser irradiation was performed, as shown in FIG. 12, even at the portion of the mold resin portion 204 closest to the connecting portion 202e, at which the temperature becomes the maximum in the mold resin portion 204, the temperature increased only to 274° C. Therefore, it is possible to suppress the thermal damage of the mold resin portion 204 by setting the dimensional relationship as in the present embodiment.

Modification of Third Embodiment

Figure 13:
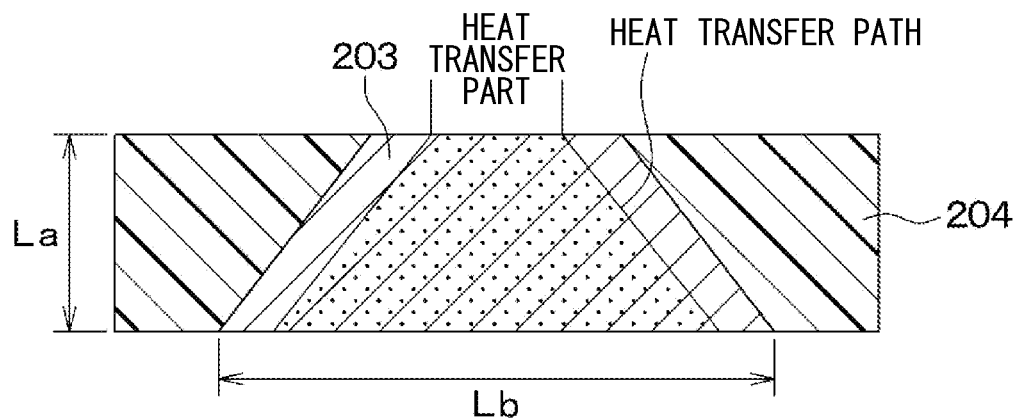
FIG. 13 is a cross-sectional view of the vicinity of a heat conductive member provided in a semiconductor device described in a modification of the third embodiment.

In the third embodiment, the case where each of the heat conductive member 203 has a cylindrical shape or a polygonal prism shape has been described. However, each of the heat conductive member 203 may have a truncated cone shape or a truncated pyramid shape. In that case, as shown in FIG. 13, in the lateral dimensions Lb of the truncated cone shape or truncated pyramid shape whose cross-sectional shape is a trapezoid, the dimension of the upper bottom is set to be equal or larger than the thickness La, and the dimension of the lower bottom is set to a dimension set in consideration of a range of heat diffusion with respect to the dimension of the upper bottom.

In both the case where each of the heat conduction member 203 has a cylindrical shape or a polygonal prism shape as in the third embodiment and the case where each of the heat conduction members 203 has a truncated cone shape or a truncated pyramid shape as shown in the modification, it is preferable that the lateral dimension Lb of each of the heat conducive members 203 is set to be larger than the range of heat diffusion. However, since the temperature decreases as progress in the thickness direction, it is not necessary to set the lateral dimension Lb of each of the heat conductive members 203 to be larger than the range of heat diffusion. For example, in the example of FIG. 12, the thickness La is 0.5 mm and the lateral dimension Lb is 1.0 mm, but even in this case, the maximum temperature was 274° C. Therefore, when the lateral dimension Lb is equal to or larger than the thickness La, the effect of suppressing increase in temperature of the mold resin portion 204 can be obtained.

Fourth Embodiment

The following describes a fourth embodiment. In the present embodiment, the configuration of the heat conductive member 203 is changed from that of the first to third embodiments, and the remaining configurations are the same as those of the first to third embodiments. Therefore, only portions different from the first to third embodiments will be described. Here, a case where the configuration of the heat conductive member 203 is changed with respect to the configuration of the first embodiment will be described, but the same applies to the configurations of the second and third embodiments.

Figure 14:
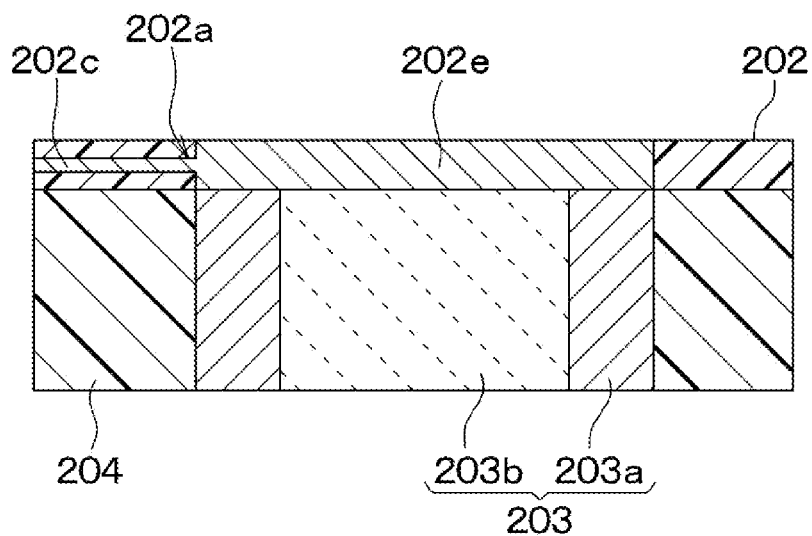
FIG. 14 is a cross-sectional view of the vicinity of a heat conductive member provided in a semiconductor device according to a fourth embodiment.

As shown in FIG. 14, the heat conductive member 203 is made of multiple materials. Specifically, the heat conductive member 203 includes a frame-shaped portion 203a arranged on an outer edge and an inner portion 203b arranged inside the frame-shaped portion 203a. The frame-shaped portion 203a and the inner portion 203b are made of different materials. The frame-shaped portion 203a is a cylindrical or polygonal cylinder having a hollow portion, and the inner portion 203b is a cylindrical or polygonal prism shape arranged in the hollow portion of the frame-shaped portion 203a.

Here, the frame-shaped portion 203a is made of a metal such as Cu, Al, and Ag, which has a higher heat conductivity than the mold resin portion 204 and is a material that serves as a conductor. Further, the inner portion 203b is made of a non-metal material having a higher heat conductivity than the mold resin portion 204, such as graphite and Si. Since graphite and Si are non-metal materials having a lower thermal capacity than metals, heat can be efficiently transferred to the portion to be the joint portion 300.

As described above, the heat conductive member 203 may be composed of the frame-shaped portion 203a and the inner portion 203b, which may be made of different materials. When at least one of the frame-shaped portion 203a and the inner portion 203b is a conductor to allow electric conduction between the metal wiring 202a and the joint portion 300, and the other is made of a material having a higher heat conductivity, heat can be transferred more efficiently to the portion to be the joint portion 300.

Modifications of Fourth Embodiment

Figure 15A:
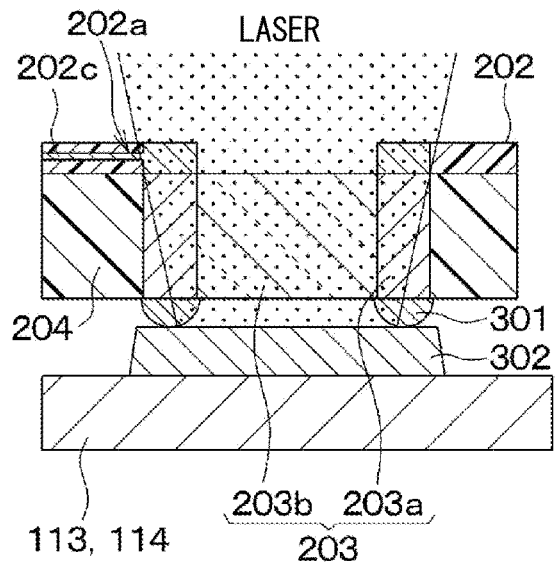
FIG. 15A is a cross-sectional view of the vicinity of a heat conductive member provided in a semiconductor device described in a first modification of the fourth embodiment, and is a view showing a state of laser irradiation.
Figure 15B:
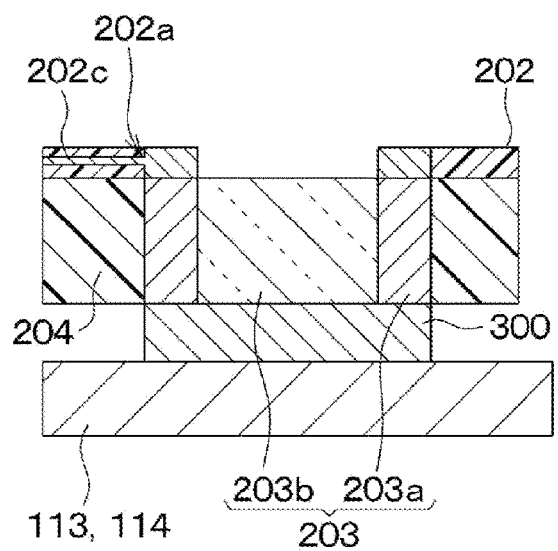
FIG. 15B is a cross-sectional view of the vicinity of a heat conductive member provided in the semiconductor device described in the first modification of the fourth embodiment, and is a view showing a state after joining.

In the fourth embodiment, the frame-shaped portion 203a is made of metal, the inner portion 203b is made of graphite, Si, or the like. However, as shown in FIGS. 15A and 15B, the inner portion 203b may be made of a material such as glass, resin, or the like through which laser light is transmitted. When the inner portion 203b is made of such a material, the heat capacity can be reduced. Further, it is also possible to directly irradiate the portion to be the joint portion 300 with the laser irradiation after the heat conductive member 203 is disposed above the signal wire 113 or the signal wire 114 as shown in FIG. 15A. Therefore, the joining material 301 and the joining material 302 can be heated more efficiently, and the joint portion 300 shown in FIG. 15B can be formed.

Figure 16A:
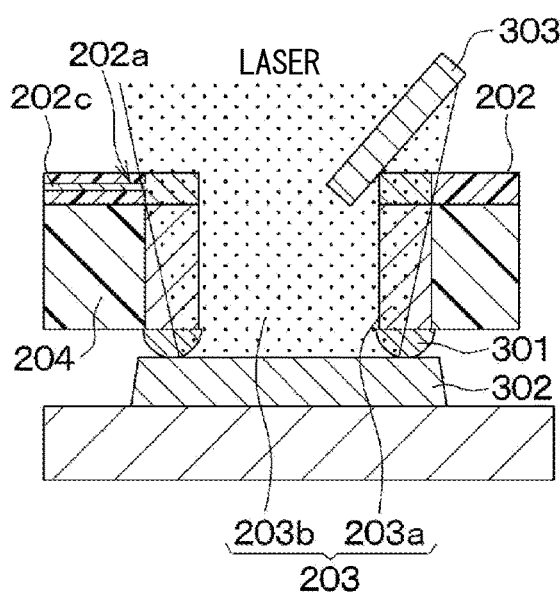
FIG. 16A is a cross-sectional view of the vicinity of a heat conductive member provided in a semiconductor device described in a second modification of the fourth embodiment, and is a view showing a state of laser irradiation.
Figure 16B:
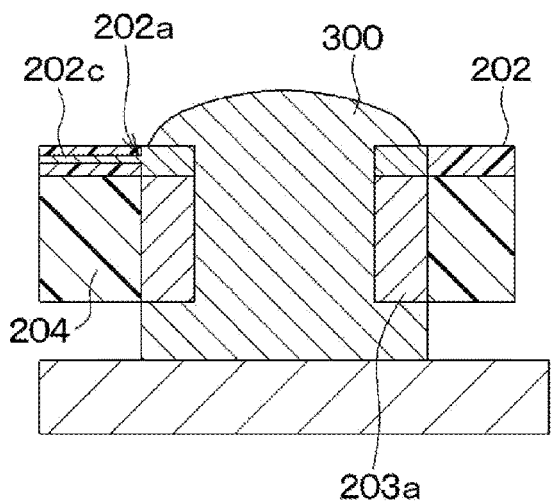
FIG. 16B is a cross-sectional view of the vicinity of a heat conductive member provided in the semiconductor device described in the second modification of the fourth embodiment, and is a view showing a state after joining.

Further, as shown in FIGS. 16A and 16B, the heat conductive member 203 may be composed of only the frame-shaped portion 203a. In that case, laser irradiation can be performed through the hollow portion of the frame-shaped portion 203a as shown in FIG. 16A, and the portion to be the joint portion 300 can be heated more efficiently. Further, it is also possible to use thread solder or the like as the joining material 303, melt the joining material 303 above the circuit package 200 and pour the joining material 303 through the hollow portion to form the joint portion 300. Further, as shown in FIG. 16B, when the joint portion 300 is formed so as to be filled in the hollow portion of the frame-shaped portion 203a, a structure excellent in electrical conductivity and strength can be obtained. Preferably, when the joint portion 300 is raised above the circuit package 200, the strength can be further increased.

Figure 17A:
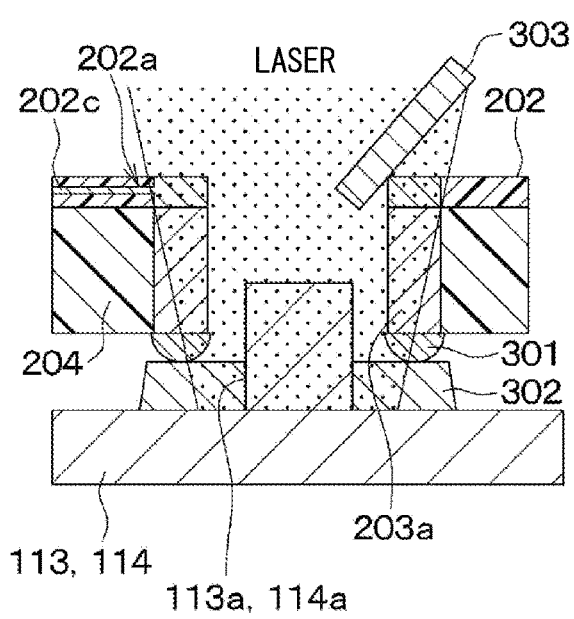
FIG. 17A is a cross-sectional view of the vicinity of a heat conductive member provided in a semiconductor device described in a third modification of the fourth embodiment, and is a view showing a state of laser irradiation.
Figure 17B:
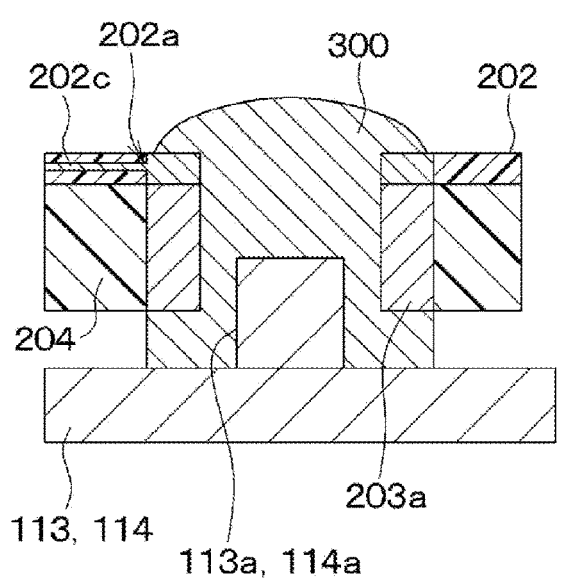
FIG. 17B is a cross-sectional view of the vicinity of a heat conductive member provided in the semiconductor device described in the third modification of the fourth embodiment, and is a view showing a state after joining.

Further, as shown in FIGS. 17A and 17B, when the heat conductive member 203 is composed of only the frame-shaped portion 203a, protrusions 113a and 114a that enter the hollow portion of the frame-shaped portion 203a may be formed in the signal wire 113 and the signal wire 114. In this case, when the circuit package 200 is disposed in the recess 102a, the protrusions 113a and 114a enter the hollow portion of the frame-shaped portion 203a, so that positioning of the circuit package 200 can be performed. Accordingly, it is possible to suppress misalignment during joining. Also in this case, laser irradiation can be performed through the hollow portion of the frame-shaped portion 203a as shown in FIG. 17A, or the joint portion 300 can be filled in the hollow portion of the frame-shaped portion 203a so as to be preferably raised as shown in FIG. 17B, so that the same effect as described above can be obtained.

Fifth Embodiment

The following describes a fifth embodiment. In the present embodiment, a method of manufacturing the circuit package 200 in the semiconductor device 1 described in the first to fourth embodiments will be described.

In the present embodiment, the circuit package 200 is manufactured by a method of preparing a semiconductor chip constituting the semiconductor element 201 before the wiring layer 202, for example, as in a chip-first manufacturing method in a fan-out wafer-level packaging.

Figure 18A:
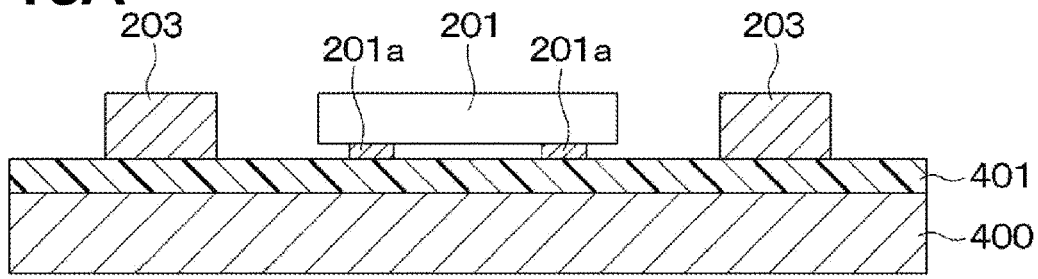
FIGS. 18A to 18E are cross-sectional views showing manufacturing processes of a circuit package provided in a semiconductor device described in a fifth embodiment.

First, as shown in FIG. 18A, a support plate 400 made of SUS or the like is prepared, and a temporary fixing tape 401 such as double-sided tape is attached to one surface of the support plate 400. Then, the semiconductor element 201 is attached to a predetermined position of the temporary fixing tape 401. At this time, the pads 201a of the semiconductor element 201 connected to the metal wiring 202a are directed toward the temporary fixing tape 401. Further, the heat conductive members 203 are disposed so as to sandwich the semiconductor element 201. The heat conductive members 203 can be formed by preparing thin plate materials that have been machined such as cutting or rolling in advance and etching them into desired shapes. Then, each of the heat conductive members 203 is arranged at a predetermined position centered on the semiconductor element 201 and attached to the temporary fixing tape 401.

Figure 18B:
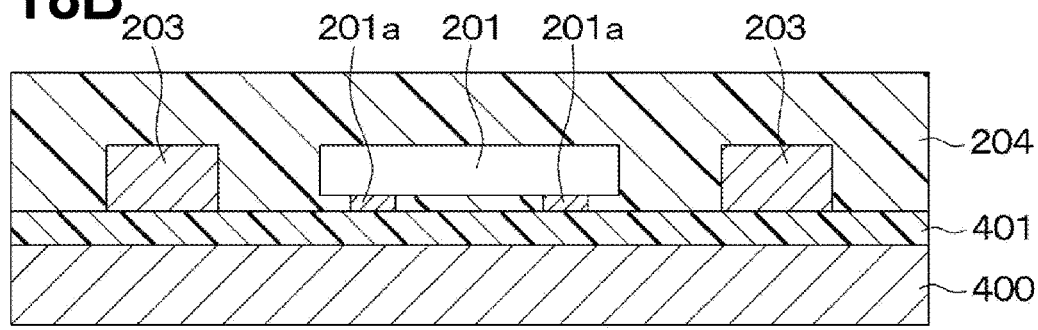
Figure 18C:
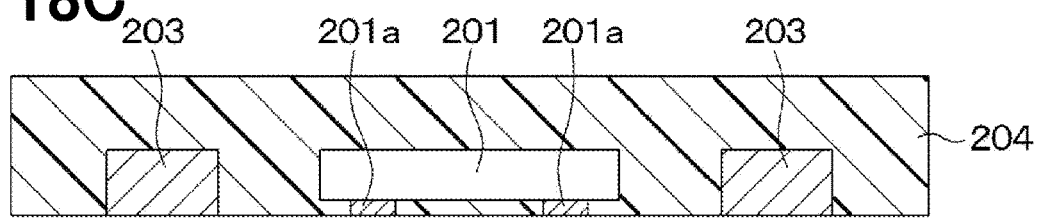

Next, as shown in FIG. 18B, the semiconductor element 201 and the heat conductive members 203 are sealed with the mold resin portion 204 while still attached to the temporary fixing tape 401. Then, as shown in FIG. 18C, the semiconductor element 201 and the heat conductive members 203 covered with the mold resin portion 204 are peeled off from the support plate 400 and the temporary fixing tape 401. For example, when the temporary fixing tape 401 is made of double-sided tape, the semiconductor element 201 and the heat conductive members 203 covered with the mold resin portion 204 can be easily peeled off by heating.

Figure 18D:
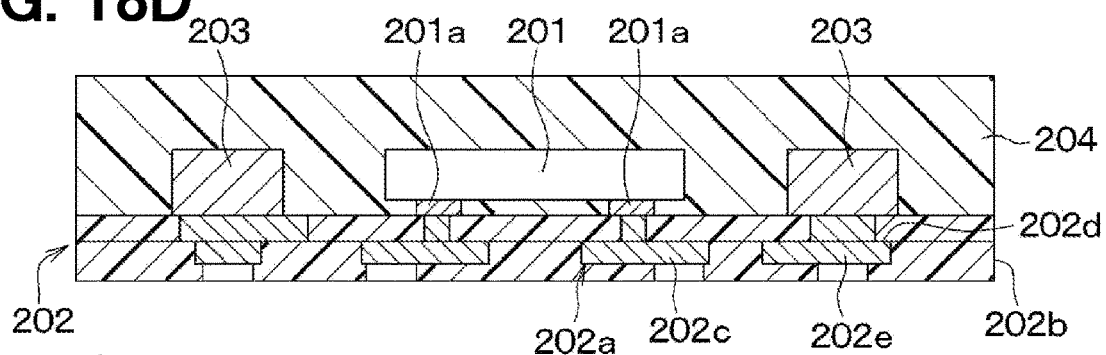

Subsequently, as shown in FIG. 18D, the wiring layer 202 is formed on surfaces of the mold resin portion 204, the semiconductor element 201, and the heat conductive member 203 from which the temporary fixing tape 401 has been peeled off. Any method may be used for forming the wiring layer 202, and for example, a method for forming a multi-layer printed circuit board can be applied. That is, after the insulating layer 202b is formed, forming of opening portions 202d by etching and forming of the metal wiring 202a and the connecting portions 202e by forming and patterning the metal layer and plating are repeatedly performed. As a result, the wiring layer 202 is formed.

Figure 18E:
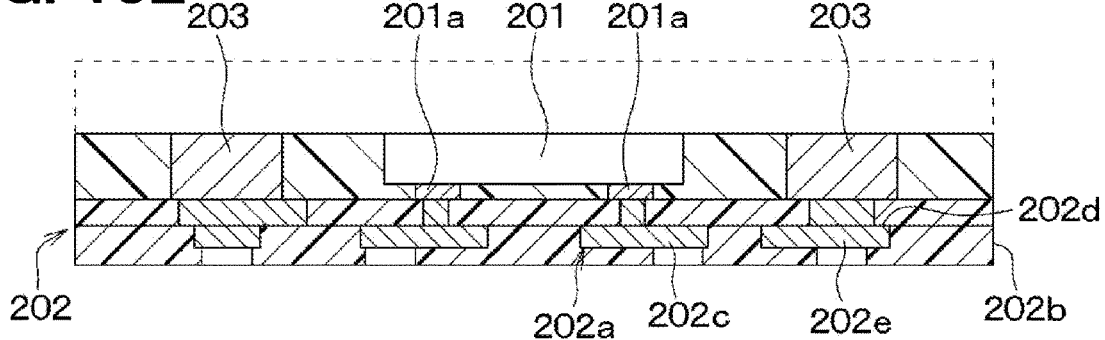

Then, as shown in FIG. 18E, a surface of the mold resin portion 204 opposite from the wiring layer 202 is ground to expose the heat conductive member 203. In this way, the circuit package 200 can be manufactured.

Modification of Fifth Embodiment

In the fifth embodiment, the case where the circuit package 200 is manufactured by the chip-first manufacturing method has been described as an example. However, the circuit package 200 may also be formed by a chip-last manufacturing method in the fan-out wafer-level packaging, or a method applied to a BGA package.

Figure 19A:
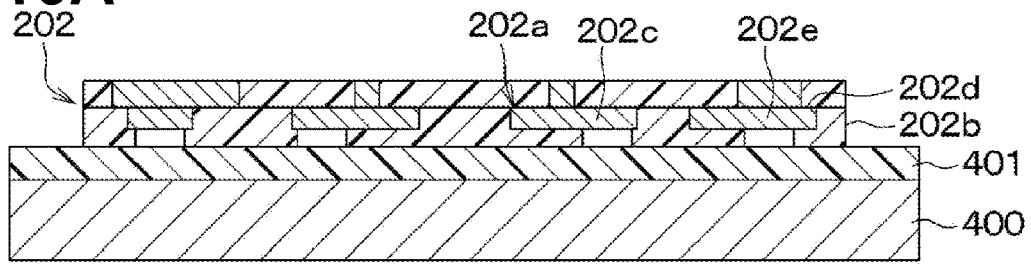
FIGS. 19A-19E are cross-sectional views showing manufacturing processes of a circuit package provided in a semiconductor device described in a modification of the fifth embodiment.

First, as shown in FIG. 19A, a support plate 400 made of SUS or the like is prepared, and a temporary fixing tape 401 such as double-sided tape is attached to one surface of the support plate 400. Then, the wiring layer 202 is formed on one side of the temporary fixing tape 401. As a method for forming the wiring layer 202, the method described in the fifth embodiment may be applied.

Figure 19B:
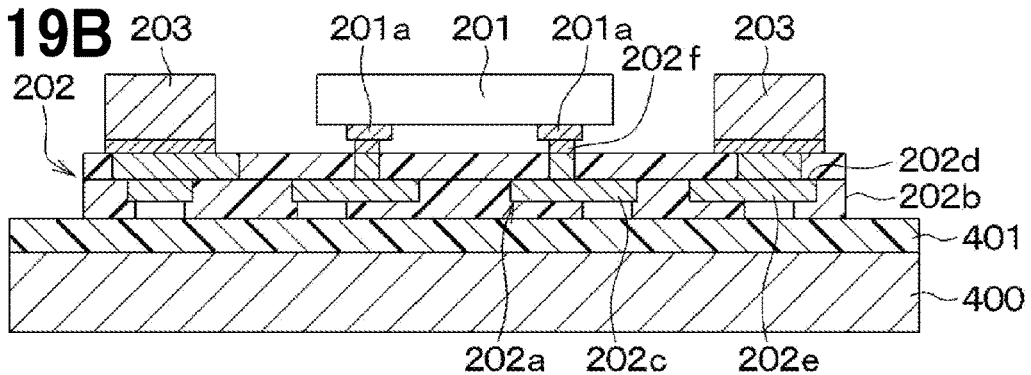

Next, as shown in FIG. 19B, the semiconductor element 201 is mounted at a predetermined position on the wiring layer 202. That is, the semiconductor element 201 is arranged in such a manner that the pads 201a face the wiring layer 202, and the pads 201a and the metal wiring 202a are connected. Further, the heat conductive members 203 are prepared as in the fifth embodiment, and the connecting portions 202e and the heat conductive members 203 are connected to each other. These connections may be made by using a bonding material 202f such as a solder, a combination of a metal post and a solder, a sintering material, a conductive adhesive, and the like.

Figure 19C:
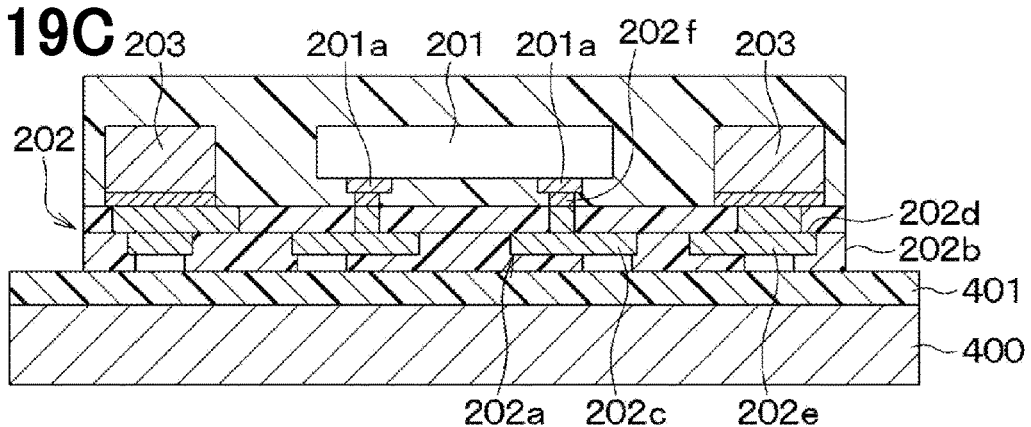
Figure 19D:
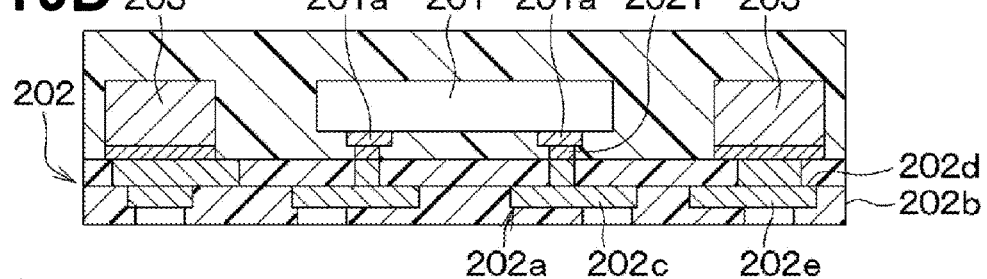

Subsequently, as shown in FIG. 19C, the semiconductor element 201 and the heat conductive members 203 arranged on the wiring layer 202 are sealed by the mold resin portion 204. Then, as shown in FIG. 19D, the wiring layer 202 is peeled off from the support plate 400 and the temporary fixing tape 401 together with the semiconductor element 201 and the heat conductive member 203 covered with the mold resin portion 204.

Figure 19E:
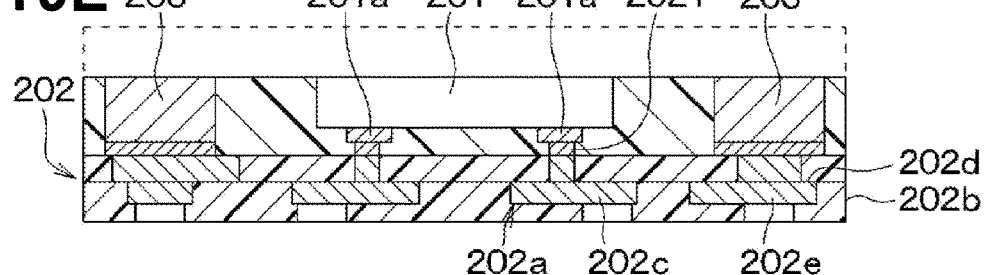

Then, as shown in FIG. 19E, a surface of the mold resin portion 204 opposite from the wiring layer 202 is ground to expose the heat conductive member 203. The circuit package 200 can also be manufactured in this way.

Sixth Embodiment

The following describes a sixth embodiment. In the present embodiment, a structure for further enhancing bonding and insulation reliability is provided with respect to the first to fifth embodiments, and the remaining configurations are the same as those in the first to fifth embodiments. Therefore, only portions different from the first to fifth embodiments will be described. Here, a case where the present embodiment is applied to the structure of the first embodiment will be described as an example.

Figure 20:
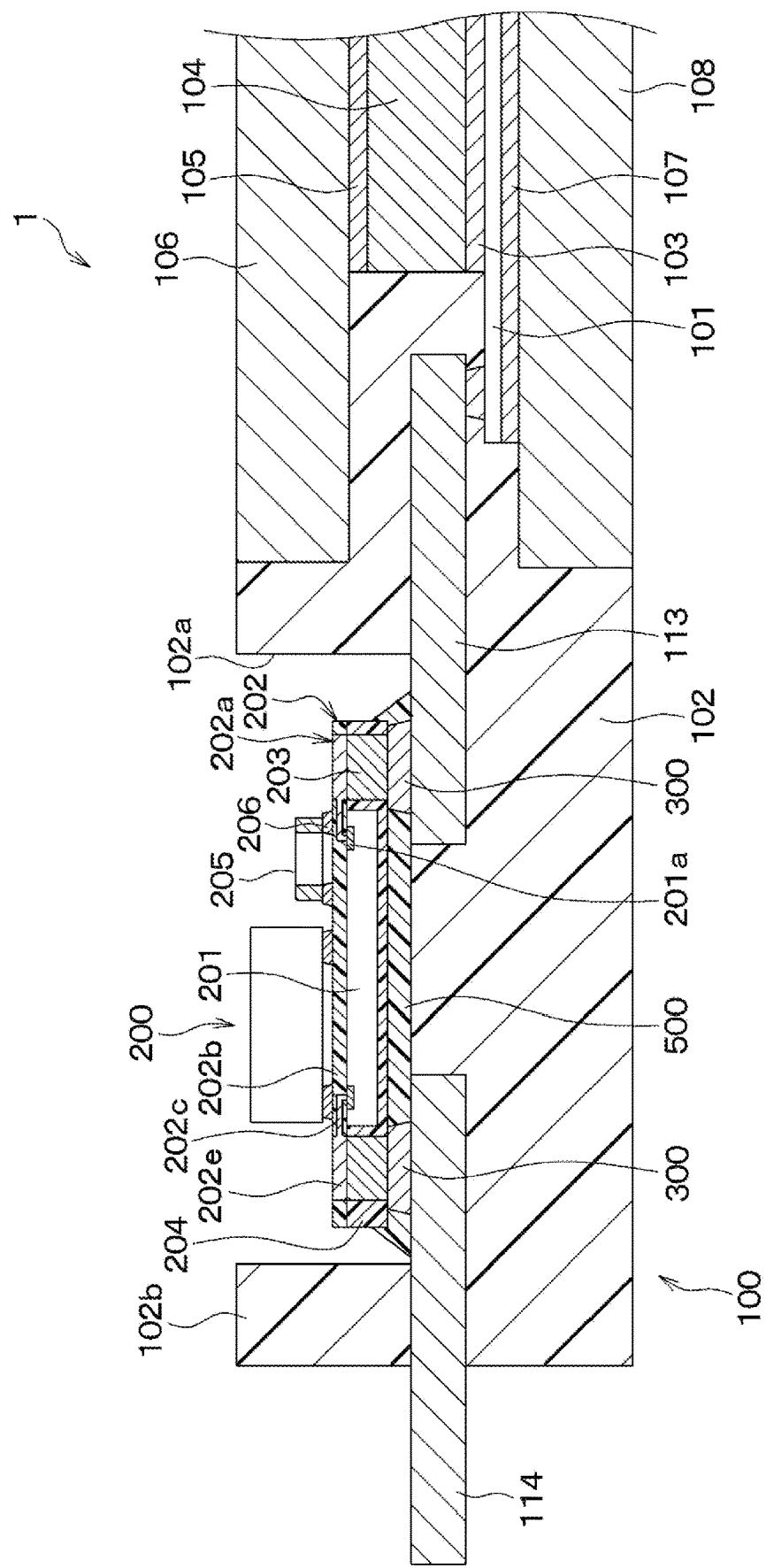
FIG. 20 is a cross-sectional view of a semiconductor device according to a sixth embodiment.

As shown in FIG. 20, the semiconductor device 1 of the present embodiment includes an underfill 500 that covers the joint portion 300. The underfill 500 is formed by filling the recess 102a with an organic resin after joining the power module 100 and the circuit package 200. The height of the underfill 500 can be set optionally, but the gap between the power module 100 and the circuit package 200 is completely filled and the height of the underfill 500 is set to be at least higher than the height of the joint portion 300.

In this way, when the joint portion 300 is covered with the underfill 500, the joint portion 300 can be isolated from the outside, and the joint and insulation reliability between the power module 100 and the circuit package 200 can be further improved.

Modification of Sixth Embodiment

In the sixth embodiment, the underfill 500 is provided. However, as shown in FIG. 21, the inside of the recess 102a may also be covered with a potting portion 501. For example, after joining the power module 100 and the circuit package 200, the recess 102a is filled with an organic resin to cover the entire circuit package 200, whereby the potting portion 501 is formed. In this case, the depth of the recess 102a is set to be equal to or greater than the thickness of the circuit package 200, that is, the total thickness of the mold resin portion 204 and the wiring layer 202 when the electronic components 205 are not provided, and the thickness of the electronic components 205 is added when the electronic components 205 are provided. Accordingly, the entire circuit package 200 can be accommodated in the recess 102a, and the entire circuit package 200 can be covered by the potting portion 501. Also in this case, effects similar to those of the sixth embodiment can be obtained.

Seventh Embodiment

The following describes a seventh embodiment. In the present embodiment, the configuration of the circuit package 200 is changed from that of the first to sixth embodiments, and the remaining configurations are the same as those of the first to sixth embodiments. Therefore, only portions different from the first to fourth embodiments will be described. Here, a case where the present embodiment is applied to the structure of the second embodiment will be described as an example.

Figure 22A:
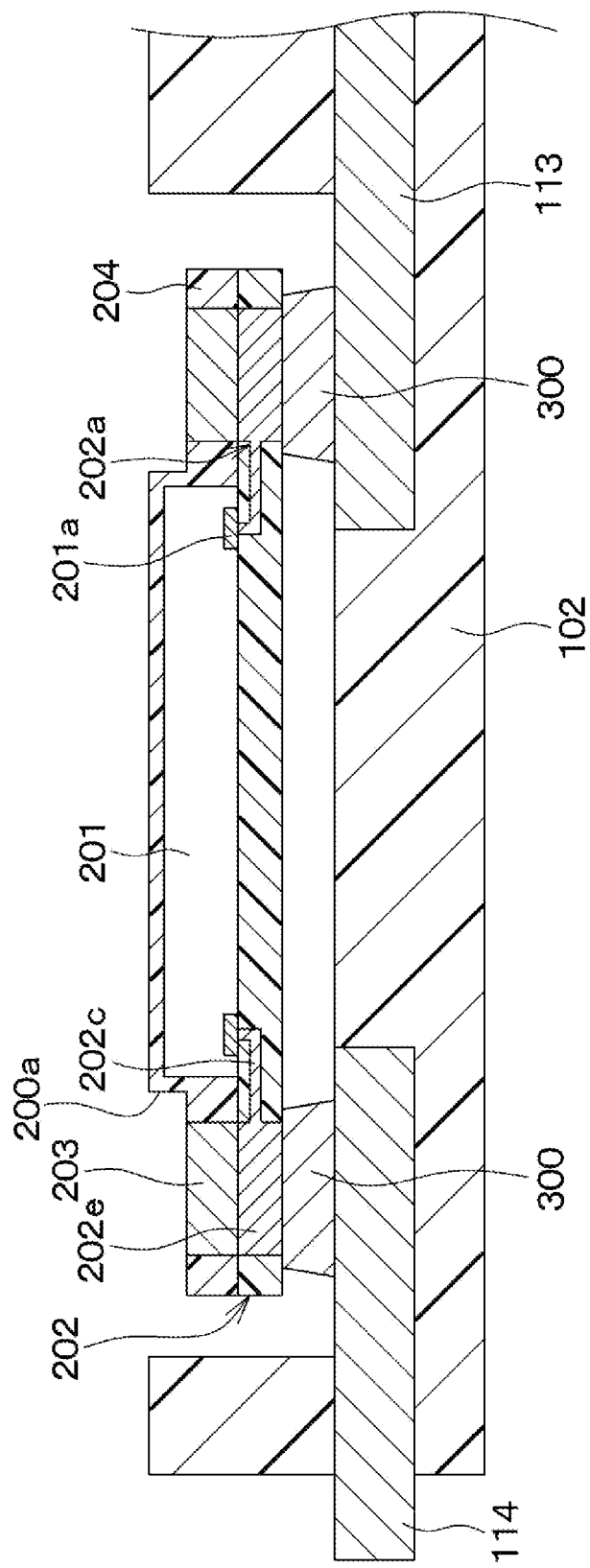
FIG. 22A is a cross-sectional view of a semiconductor device according to a seventh embodiment.

As shown in FIG. 22A, in the semiconductor device 1 of the present embodiment, a thickness of portions of the circuit package 200 in which the heat conductive members 203 are disposed is set to be thinner than the portion in which the semiconductor element 201 is disposed. Specifically, the portion of the circuit package 200 in which the semiconductor element 201 is arranged is set as an inner portion, a portion located outside the inner portion to an end of the circuit package 200 is set as a recessed portion 200a thinner than the inner portion. Such a structure is configured by, for example, manufacturing the circuit package 200 by the manufacturing method as in the fifth embodiment, and then processing the outer portion by cutting or the like. The range of thinning may be limited to the portions corresponding to the heat conductive members 203, but processing is easier when the range of thinning is a line shape along each long side of the circuit package 200 having a rectangular shape. Further, instead of the cutting process, a molding die for molding the mold resin portion 204 may have such a shape that makes the outer portion thinner than the inner portion.

In this way, the portions of the circuit package 200 in which the heat conductive member 203 are arranged are thinner than the inner portion. With such a configuration, when the power module 100 and the circuit package 200 are joined via the joint portions 300, the heat conduction path when heating is performed can be shortened. Therefore, heat can be transferred to the portions to be the joint portions 300 more efficiently, and thermal damage to the surrounding mold resin portion 204 can be suppressed.

Although the case where the present embodiment is applied to the structure of the second embodiment has been described here, of course, the present embodiment can also be applied to the structure of the first embodiment and the like. Also in this case, as shown in FIG. 22B, a recessed portion 200a thinner than the inner portion may be provided outside the inner portion of the circuit package 200 in which the semiconductor element 201 is disposed to an end portion of the circuit package 200.

Modifications of Seventh Embodiment

In the seventh embodiment, the outer portion of the circuit package 200 has the recessed portion 200a up to the end portion of the circuit package 200. However, the range of the recessed portion 200a can be changed. Specifically, as shown in FIGS. 23A and 23B, the recessed portion 200a may be located inside the end portion of the circuit package 200. Even in this way, when the power module 100 and the circuit package 200 are joined via the joint portion 300, the heat conduction path during heating can be shortened. Therefore, effects similar to those of the seventh embodiment can be obtained.

Eighth Embodiment

The following describes an eighth embodiment. In the present embodiment, a configuration for further suppressing the thermal damage of the mold resin portion 204 is provided with respect to the first to seventh embodiments, and the remaining configurations are same as those of the first to seventh embodiments. Therefore, only portions different from the first to seventh embodiments will be described.

Figure 24:
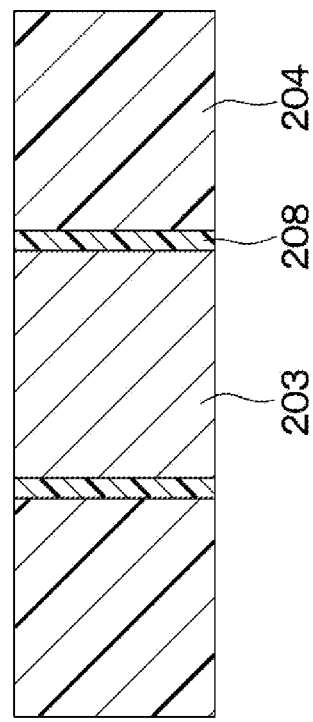
FIG. 24 is a cross-sectional view of the vicinity of a heat conductive member provided in a semiconductor device according to an eighth embodiment.

As shown in FIG. 24, the semiconductor device 1 of the present embodiment includes low heat conductivity portions 208 disposed between the heat conductive member 203 and the mold resin portion 204 in the circuit package 200. The low heat conductivity portions 208 have a lower heat conductivity than the heat conductive members 203. The low heat conductivity portions 208 are made of a material having a low heat conductivity such as polyimide and having a higher heat resistance than the mold resin portion 204.

As described above, by providing the low heat conductivity portions 208 between the heat conductive members 203 and the mold resin portion 204, heat transfer from the heat conductive members 203 to the mold resin portion 204 is suppressed. Therefore, it is possible to suppress the thermal damage of the mold resin portion 204.

Figure 25A:
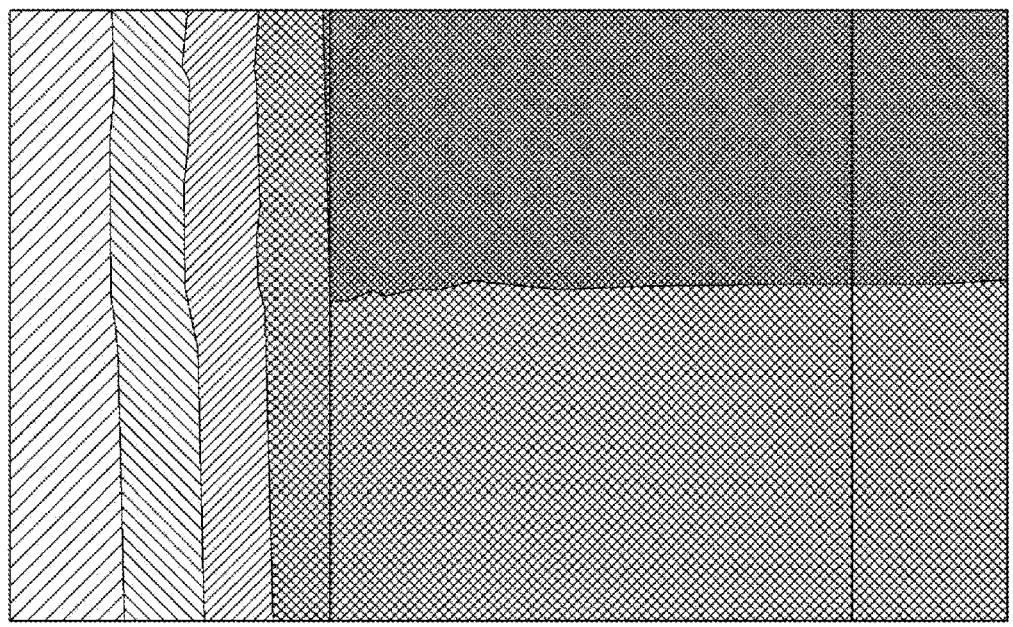
FIG. 25A is a temperature distribution diagram in the vicinity of a heat conductive member in a case where a low heat conductivity portion is not provided.
Figure 25B:
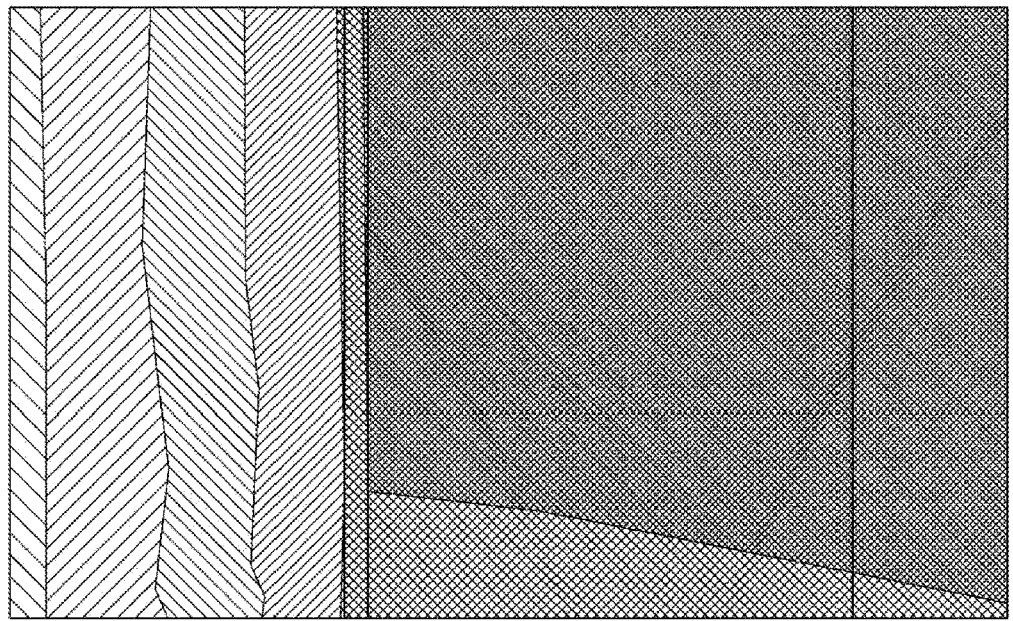
FIG. 25B is a temperature distribution diagram in the vicinity of a heat conductive member in a case where a low heat conductivity portion is provided.

As a reference, the temperature in the vicinity of the heat conductive member 203 was investigated by simulation in each of a case with the low heat conductivity portions 208 and a case without the low heat conductivity portions 208. FIGS. 25A and 25B show the results of the simulation. As shown in FIG. 25A, when the low heat conductivity portions 208 are not provided, the maximum temperature of the mold resin portion 204 was 274° C. However, as shown in FIG. 25B, when the low heat conductivity portions 208 are provided, the maximum temperature of the mold resin portion 204 was 246° C. From the results of the simulation, it can be seen that the thermal damage of the mold resin portion 204 can be suppressed by providing the low thermal conduction portions 208.

The low heat conductivity portions 208 may be arranged between the heat conductive members 203 and the mold resin portion 204 by any method. For example, when a liquid resin is applied to side surfaces of the heat conductive members 203 by spin coating before sealing the heat conductive members 203 by the mold resin portion 204, the low heat conductivity portions 208 can be easily formed. When the low heat conductivity portions 208 are formed by such a method, for example, if the circuit package 200 is manufactured by the method shown in the modification of the fifth embodiment, the low heat conductivity portions 208 are formed from the side surfaces of the heat conductive members 203 to the surface of the wiring layer 202. Therefore, it is possible to improve the joinability between the heat conductive members 203 and the wiring layer 202.

Ninth Embodiment

The following describes a ninth embodiment. In the present embodiment, a configuration of a heated surface is changed from that of the first to eighth embodiments, and the remaining configurations are the same as those of the first to eighth embodiments. Therefore, only portions different from the first to eighth embodiments will be described. Although a case where the configuration of the present embodiment is applied to the first embodiment will be described here, the configuration of the present embodiment can also be applied to the second to eighth embodiments.

As shown in FIG. 26, in the semiconductor device 1 of the present embodiment, a laser absorption film 209 made of a material having a high absorption rate of a laser beam is provided on a heated surface of the circuit package 200. Specifically, the laser absorption film 209 is formed on the surfaces of the connecting portions 202e opposite from the heat conductive members 203 and the joint portions 300 using a material having a higher absorption rate of a laser beam than the metal constituting the connecting portions 202e. The laser beam referred to here is a laser beam used for laser irradiation for heating. For example, when the connecting portions 202e are made of Cu, Al, or Ag, the laser absorption film 209 can be made of Ni (nickel) or the like. The laser absorption film 209 can be formed by plating or the like.

By providing the laser absorption film 209 in this way, it is possible to increase the laser absorption efficiency when the heating for forming the joint portions 300 by melting is performed by laser irradiation. Therefore, the joining material 301 and the joining material 302 can be melted with less laser energy, and the maximum temperature of the mold resin portion 204 can be lowered, so that thermal damage to the mold resin portion 204 can be further suppressed.

Here, a case where the laser irradiation is performed from a direction close to the connecting portions 202e as in the first embodiment is taken as an example, but the laser irradiation may be performed from a direction close to the heat conductive members 203 as in the second embodiment. In that case, the heated surfaces of the heat conductive members 203 may be provided with a laser absorption film 209 made of a material having a higher absorption rate of laser beam than the heat conductive members 203.

Tenth Embodiment

The following describes a tenth embodiment. In the present embodiment, a heating method is changed from that of the first to eighth embodiments, and the remaining configurations are the same as those of the first to eighth embodiments. Therefore, only portions different from the first to eighth embodiments will be described. Although a case where the heating method of the present embodiment is applied to the first embodiment will be described here, the heating method of the present embodiment can also be applied to the second to eighth embodiments.

In the first to eighth embodiments, laser irradiation is taken as an example as a heating method for forming the joint portions 300. However, as shown in FIG. 27, a jig 600 such as a trowel for heating is prepared, the jig 600 is pressed against the heated surfaces of the connecting portions 202e, and the joint portions 300 may be formed by heating by physical contact.

Other Embodiments

While the present disclosure has been described in accordance with the embodiments described above, the present disclosure is not limited to the embodiments and includes various modifications and equivalent modifications. In addition, while the various elements are shown in various combinations and configurations, which are exemplary, other combinations and configurations, including more, less or only a single element, are also within the spirit and scope of the present disclosure.

For example, as the semiconductor device 1, a configuration in which two semiconductor elements 201 and a corresponding number of heat sinks 106, heat sinks 108, signal wires 113, and the like are provided will be described as an example. However, these are merely examples of the semiconductor device 1 configured by joining the power module 100 and the circuit package 200, and the number, layout, and the like of the semiconductor element 201 and other components provided in the power module 100 can be set optionally.

Although the laser diameter at the time of laser irradiation is generally 0.5 mm or more, it is of course possible to perform laser irradiation with a laser diameter smaller than 0.5 mm. However, if the lateral dimension Lb of the connecting portions 202e or the heat conductive members 203 constituting the heated surfaces is 0.5 mm or more, heating by general laser irradiation can be performed, so that versatility can be enhanced.

Further, in each of the above embodiments, the case where the recess 102a is formed in the power module 100 and the circuit package 200 is disposed in the recess 102a has been described as an example. When the circuit package 200 is disposed in the recess 102a, it is difficult to perform laser irradiation aiming at the gap between the power module 100 and the circuit package 200, so that the present disclosure is particularly effective. However, even when the recess 102a is not formed in the power module 100, heating by laser irradiation or physical contact may be performed from above the circuit package 200, so that the heating process can be simplified. Further, when laser irradiation is performed to melt the solder by aiming at the gap between the power module 100 and the circuit package 200 regardless of the presence or absence of the recess 102a, it takes a long time to melt all the solder. Therefore, a mechanism to heat the work is required so that the solder does not solidify immediately.

In addition to the examples described here as other embodiments, in each of the above embodiments, the elements included in each of the above embodiments are not necessarily essential except when explicitly stated as being particularly essential, or when they are clearly essential in principle. Further, in each of the above-described embodiments, when numerical values such as the number, quantity, range, and the like of the constituent elements of the embodiment are referred to, except in the case where the numerical values are expressly indispensable in particular, the case where the numerical values are obviously limited to a specific number in principle, and the like, the present disclosure is not limited to the specific number. Further, in each of the above embodiments, when the shape of an element or the positional relationship between elements is mentioned, the present disclosure is not limited to the specific shape or positional relationship unless otherwise particularly specified or unless the present disclosure is limited to the specific shape or positional relationship in principle.

What is claimed is:

1. A semiconductor device comprising:
   a power module including
     a power semiconductor element,
     a signal wire connected to the power semiconductor element, and
     a first mold resin portion sealing the power semiconductor element and the signal wire while exposing a part of the signal wire;
   a circuit package including
     a semiconductor element,
     a wiring layer including an insulating layer and a metal wiring, the metal wiring disposed in the insulating layer and electrically connected to the semiconductor element, the metal wiring including a connecting portion,
     a heat conductive member disposed at a position different from the semiconductor element and connected with the connecting portion included in the metal wiring, and
     a second mold resin portion sealing the semiconductor element and the heat conductive member; and
   a joint portion disposed between the power module and the circuit package and joining the power module and the circuit package, wherein
   one of the connecting portion or the heat conductive member is joined with the signal wire via the joint portion,
   the heat conductive member penetrates the second mold resin portion in a thickness direction of the semiconductor element, and
   the heat conductive member and the connecting portion are arranged in a straight line in the thickness direction of the semiconductor element.

2. The semiconductor device according to claim 1, wherein
a surface of another one of the heat conductive member or the connecting portion located opposite from the joint portion is exposed from the second mold resin portion.

3. The semiconductor device according to claim 1, wherein
the circuit package further includes a laser absorption film on a surface of another one of the heat conductive member or the connecting portion located opposite from the joint portion, and
the laser absorption film has a higher absorption rate of a laser beam than the another one of the heat conductive member or the connecting portion.

4. The semiconductor device according to claim 1, wherein
the circuit package further includes an insulating material that covers a surface of another one of the heat conductive member or the connecting portion located opposite from the joint portion.

5. The semiconductor device according to claim 1, wherein
when a shortest dimension of the heat conductive member in a direction passing through a central axis of the heat conductive member and orthogonal to the thickness direction of the semiconductor element is referred to as a lateral dimension, the lateral dimension is 0.5 mm or more.

6. The semiconductor device according to claim 1, wherein
when a dimension of the heat conductive member in a direction same as the thickness direction of the semiconductor element is La and a shortest dimension of the heat conductive member in a direction passing through a central axis of the heat conductive member and orthogonal to the thickness direction of the semiconductor element is Lb, the heat conductive member has a flat shape that satisfies a relationship of La<Lb.

7. The semiconductor device according to claim 1, wherein
the heat conductive member is made of Cu, Al, or Ag.

8. The semiconductor device according to claim 1, wherein
a thickness of a portion of the circuit package in which the heat conductive member is disposed is thinner than a thickness of a portion of the circuit package in which the semiconductor element is disposed.

9. The semiconductor device according to claim 1, wherein
the heat conductive member includes a frame-shaped portion, and
an inside of the frame-shaped portion is a hollow portion or an inner portion made of a material that transmits a laser beam.

10. The semiconductor device according to claim 1, wherein
the heat conductive member includes a frame-shaped portion and an inner portion disposed inside the frame-shaped portion, and
the inner portion is made of a non-metal material having a higher heat conductivity than the mold resin portion.

11. The semiconductor device according to claim 1, wherein
the first mold resin portion has a recess in which the circuit package is accommodated.

12. The semiconductor device according to claim 1, wherein
the circuit package further includes a low heat conductivity portion disposed between the heat conductive member and the second mold resin portion, and
the low heat conductivity portion is made of a material having a lower heat conductivity than the heat conductive member and having a higher heat resistance than the second mold resin portion.

13. A manufacturing method of a semiconductor device comprising:
preparing a power module including a power semiconductor element, a signal wire, and a first mold resin portion, the signal wire connected to the power semiconductor element, and the first mold resin portion sealing the power semiconductor element and the signal wire while exposing a part of the signal wire;
preparing a circuit package including a semiconductor element, a wiring layer, a heat conductive member, and a second mold resin portion, the wiring layer including an insulating layer and a metal wiring, the metal wiring disposed in the insulating layer and electrically connected to the semiconductor element, the metal wiring including a connecting portion, the heat conductive member disposed at a position different from the semiconductor element and connected with the connecting portion included in the metal wiring, the second mold resin portion sealing the semiconductor element and the heat conductive member, the heat conductive member penetrating the second mold resin portion in a thickness direction of the semiconductor element, and the connecting portion and the heat conductive member arranged in a straight line in the thickness direction of the semiconductor element;
mounting the circuit package to the power module via a joint portion made of a joining material; and
joining the power module and the circuit package by the joint portion by melting and solidifying the joining material between the circuit package and the power module, wherein
the melting of the joining material includes laser irradiation or physical contact with a heating jig to a surface of the circuit package located opposite from the power module to transfer heat to the joint portion through the connecting portion and the heat conductive member.

* * * * *